(12) United States Patent
Ahn et al.

(10) Patent No.: US 12,387,630 B2
(45) Date of Patent: Aug. 12, 2025

(54) DISPLAY DEVICE AND METHOD FOR FABRICATING SAME

(71) Applicant: Samsung Display Co., LTD., Yongin-si (KR)

(72) Inventors: Yi Joon Ahn, Seoul (KR); Eun-Kyung Yeon, Suwon-si (KR); Jaebeen Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 435 days.

(21) Appl. No.: 17/656,560

(22) Filed: Mar. 25, 2022

(65) Prior Publication Data

US 2022/0319357 A1  Oct. 6, 2022

(30) Foreign Application Priority Data

Mar. 31, 2021 (KR) .................. 10-2021-0041894
Sep. 3, 2021 (KR) .................. 10-2021-0117531

(51) Int. Cl.
*G09F 9/30* (2006.01)
*H10K 50/84* (2023.01)
(Continued)

(52) U.S. Cl.
CPC ............. *G09F 9/301* (2013.01); *H10K 50/84* (2023.02); *H10K 71/00* (2023.02); *H10K 2102/311* (2023.02)

(58) Field of Classification Search
CPC .. G09F 9/301; H10K 50/84; H10K 2102/311; H10K 77/111; Y10T 428/29331; Y10T 428/2419
See application file for complete search history.

(56) References Cited

U.S. PATENT DOCUMENTS 7,709,285 B2  5/2010  Van Beek et al.
7,710,370 B2  5/2010  Slikkerveer et al.
(Continued)

FOREIGN PATENT DOCUMENTS

KR   10-1049240 B1   7/2011
KR   10-1140688 B1   5/2012
(Continued)

OTHER PUBLICATIONS

[NPL-1] Kim (WO 2020/105794 A1); May 28, 2020 (EPO machine translation to English). (Year: 2020).*

(Continued)

*Primary Examiner* — Donald M Flores, Jr.
(74) *Attorney, Agent, or Firm* — Womble Bond Dickinson (US) LLP

(57) ABSTRACT

A display device including a display panel and a supporter. The display panel includes a base layer that includes a plurality of stopper patterns and a support layer coupled to the plurality of stopper patterns. The supporter supports the plurality of stopper patterns and the support layer. The supporter includes a plurality of support blocks, each of which extends along the first direction and which are arrayed along the second direction. The plurality of support blocks include a first support block and a second support block spaced apart from each other in the second direction. The first support block includes a second portion overlapping the first stopper pattern among the plurality of stopper patterns when viewed in a plan view, and the second support block includes a first portion overlapping the first stopper pattern when viewed in a plan view.

18 Claims, 24 Drawing Sheets

(51) Int. Cl.
*H10K 71/00* (2023.01)
*H10K 102/00* (2023.01)

(56) References Cited

U.S. PATENT DOCUMENTS

| | | | |
|---|---|---|---|
| 10,198,041 | B2 | 2/2019 | Myeong et al. |
| 10,285,263 | B2 | 5/2019 | Hong et al. |
| 10,948,947 | B2 | 3/2021 | Yoon et al. |
| 2017/0359910 | A1* | 12/2017 | Seo .................. H05K 5/0217 |
| 2018/0124931 | A1* | 5/2018 | Choi .................. G09F 9/301 |
| 2018/0150108 | A1* | 5/2018 | Song .................. H10K 59/40 |
| 2018/0190936 | A1* | 7/2018 | Lee .................. B32B 3/30 |
| 2018/0192527 | A1* | 7/2018 | Yun .................. G09F 9/301 |
| 2018/0343756 | A1 | 11/2018 | Lin et al. |
| 2021/0192989 | A1 | 6/2021 | Ahn et al. |
| 2022/0238821 | A1* | 7/2022 | Cho .................. H10K 59/87 |
| 2022/0317732 | A1* | 10/2022 | Lee .................. G06F 1/1641 |

FOREIGN PATENT DOCUMENTS

| | | |
|---|---|---|
| KR | 10-2016-0028568 A | 3/2016 |
| KR | 10-2018-0039220 | 4/2018 |
| KR | 10-2018-0075054 A | 7/2018 |
| KR | 10-2020-0045584 A | 5/2020 |
| KR | 10-2020-0051104 A | 5/2020 |
| WO | WO-2020105794 A1 * 5/2020 ........... G06F 1/1616 |

OTHER PUBLICATIONS https://www.lg.com/global/lg-signature/rollable-oled-tv-r.
International Search Report for PCT Application No. PCT/KR2022/004108 dated Jun. 22, 2022, 3 pages.

* cited by examiner

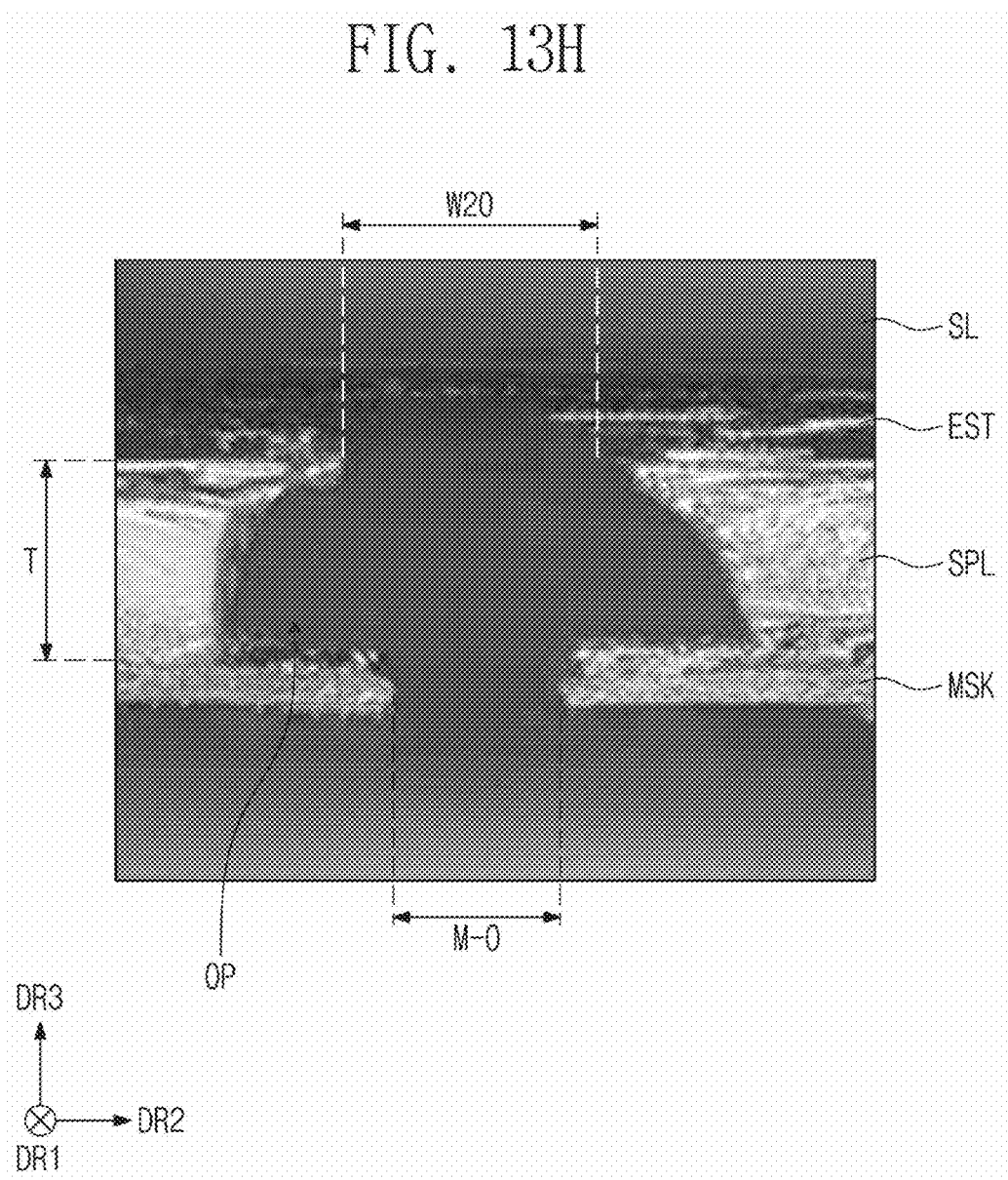

DISPLAY DEVICE AND METHOD FOR FABRICATING SAME

CROSS-REFERENCE TO RELATED APPLICATIONS

The present application claims priority to and the benefit of Korean Patent Application Nos. 10-2021-0041894, filed on Mar. 31, 2021, and 10-2021-0117531, filed on Sep. 3, 2021, the entire content of which is hereby incorporated by reference.

BACKGROUND

Aspects of some embodiments of the present disclosure relate to a display device and a method for fabricating same, and for example, to a flexible display device and a method for fabricating same.

Electronic apparatuses such as smart phones, tablet PCs, laptop computers, vehicle navigation units, and smart televisions have been developed. Such electronic apparatuses are equipped with display devices for providing information.

Various types of display devices have been developed to satisfy UX/UI of users. Among the display devices, flexible display devices have been actively developed.

The above information disclosed in this Background section is only for enhancement of understanding of the background and therefore the information discussed in this Background section does not necessarily constitute prior art.

SUMMARY

Aspects of some embodiments of the present disclosure include a flexible display device having a relatively reduced defect rate.

Aspects of some embodiments of the present disclosure also include a method for fabricating a flexible display device.

Aspects of some embodiments of the inventive concept include a display device including a display panel and a supporter. The display panel includes a base layer. The base layer includes a plurality of stopper patterns and a support layer coupled to the plurality of stopper patterns. Each of the plurality of stopper patterns extends along a first direction, and the plurality of stopper patterns are arrayed along a second direction crossing the first direction. The supporter supports a bottom surface of the base layer which is defined by the plurality of stopper patterns and the support layer. The supporter includes a plurality of support blocks, each of which extends along the first direction and which are arrayed along the second direction. The plurality of support blocks include a first support block and a second support block which are spaced apart from each other in the second direction, and the plurality of stopper patterns include a first stopper pattern and a second stopper pattern which are spaced apart from each other in the second direction. The first support block includes a second portion that overlaps the first stopper pattern when viewed in a plan view, and the second support block includes a first portion that overlaps the first stopper pattern when viewed in a plan view.

According to some embodiments, a groove may be defined in each of the plurality of stopper patterns, and the groove may extend along the first direction.

According to some embodiments, a length of the groove in the first direction may be substantially the same as a length of the base layer in the first direction.

According to some embodiments, a portion of a top surface of the second support block may be in contact with the first stopper pattern and the support layer.

According to some embodiments, a first groove may be defined in the first stopper pattern, and a second groove may be defined in the second stopper pattern. A portion of a top surface of the second support block may be in contact with the first stopper pattern and the support layer, and another portion of the top surface of the second support block may overlap the first groove.

According to some embodiments, a width of the first groove may be greater than a minimum gap between the first support block and the second support block.

According to some embodiments, the display panel may provide a flat display surface in a first mode, and the display panel may be wound on a roller in a second mode. A distance in the second mode between the second support block and the bottom surface of the base layer corresponding to the first groove may be greater than a distance in the first mode between the second support block and the bottom surface of the base layer corresponding to the first groove.

According to some embodiments, the second support block may further include a second portion overlapping the second stopper pattern and a third portion between the first portion of the second support block and the second portion of the second support block.

According to some embodiments, a gap between the first support block and the second support block may be the smallest on an extension line of a top surface of the first support block and a top surface of the second support block, and the gap between the first support block and the second support block may be the largest on an extension line of a bottom surface of the first support block and a bottom surface of the second support block.

According to some embodiments, the support layer may include a synthetic resin, and each of the plurality of stopper patterns may include a metal.

According to some embodiments, each of the plurality of support blocks may include glass.

According to some embodiments, the display panel may include one end and the other end that face each other in the second direction, and the plurality of support blocks may further include a first outer support block and a second outer support block with the first support block and the second support block therebetween. The first outer support block may support the one end of the display panel, and the second outer support block may support the other end of the display panel.

According to some embodiments, the display panel may further include: a pixel layer on the top surface of the base layer; and an encapsulation layer on the pixel layer.

According to some embodiments, the display panel may include a first planar area, a folding area, and a second planar area arrayed in the second direction, the plurality of support blocks may overlap the folding area, and the supporter may further include a first support plate overlapping the first planar area and a second support plate overlapping the second planar area.

According to some embodiments, a groove may be defined in each of the plurality of stopper patterns, and among the plurality of stopper patterns, the stopper pattern on the outermost side in the second direction may overlap the folding area and the first planar area.

According to some embodiments, a side surface of the second portion of the first support block may be a curve surface, and a side surface of the first portion of the second support block may be a curve surface.

According to some embodiments, a side surface of the second portion of the first support block may be symmetric to a side surface of the first portion of the second support block with respect to a reference plane having the second direction as a normal line.

According to some embodiments of the inventive concept, a display device includes: a display panel including a base layer that includes a first groove and a second groove defined in a bottom surface thereof; and a supporter including a first support block overlapping the first groove, a second support block overlapping the first groove and the second groove, and a third support block overlapping the second groove. The supporter supports the bottom surface of the base layer. A second area of a support surface of the first support block is spaced apart from the base layer by the first groove, a first area of a support surface of the second support block is spaced apart from the base layer by the first groove, and a second area of the support surface of the second support block is spaced apart from the base layer by the second groove, and a first area of a support surface of the third support block is spaced apart from the base layer by the second groove.

According to some embodiments of the inventive concept, a display device includes: a display panel including a base layer, wherein the base layer includes a plurality of stopper patterns and a support layer coupled to the plurality of stopper patterns, each of the plurality of stopper patterns extends along a first direction, and the plurality of stopper patterns are arrayed along a second direction crossing the first direction; and a glass supporter supporting the plurality of stopper patterns and the support layer, the glass supporter having a plurality of grooves which are defined in a bottom surface thereof and respectively correspond to the plurality of stopper patterns.

According to some embodiments of the inventive concept, a method for fabricating a display device includes: forming a plurality of stopper patterns on one surface of a support substrate, wherein each of the stopper patterns extends along a first direction, and the stopper patterns are arrayed along a second direction crossing the first direction; forming a support layer on the one surface of the support substrate, wherein the support layer covers the plurality of stopper patterns; forming a pixel layer and an encapsulation layer on the support layer; and etching on etching areas of the support substrate, wherein the etching areas respectively correspond to the plurality of stopper patterns.

According to some embodiments, prior to forming the plurality of stopper patterns, the method may further include: forming a plurality of laser irradiation areas on the other surface of the support substrate, wherein the laser irradiation areas respectively correspond to the etching areas of the support substrate; and forming a plurality of sacrificial patterns between the one surface of the support substrate and the plurality of stopper patterns.

According to some embodiments, each of the plurality of laser irradiation areas may extend from the other surface of the support substrate to the one surface of the support substrate.

According to some embodiments, in the forming of the plurality of stopper patterns, each of the plurality of stopper patterns may enclose the corresponding sacrificial pattern among the plurality of sacrificial patterns.

According to some embodiments, each of the plurality of stopper patterns may include a metal, and each of the sacrificial patterns may include a silicon oxide, a silicon nitride, or a silicon oxynitride.

According to some embodiments, the support substrate may include a glass substrate, and the etching on the etching areas of the support substrate may be performed by using an etching solution, and the etching solution may include a hydrogen fluoride.

According to some embodiments, prior to the etching on the etching areas of the support substrate, the method may further include forming a protection layer on the encapsulation layer.

According to some embodiments, the method may further include forming a mask on the other surface of the support substrate. The mask may have openings that respectively correspond the etching areas of the support substrate.

According to some embodiments, the mask may include a photoresist layer or a synthetic resin layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of some embodiments of the inventive concept. In the drawings:

FIGS. 13A to 13J are cross-sectional views illustrating a fabrication method of a display device according to some embodiments of the inventive concept;

DETAILED DESCRIPTION

Figure 1A:
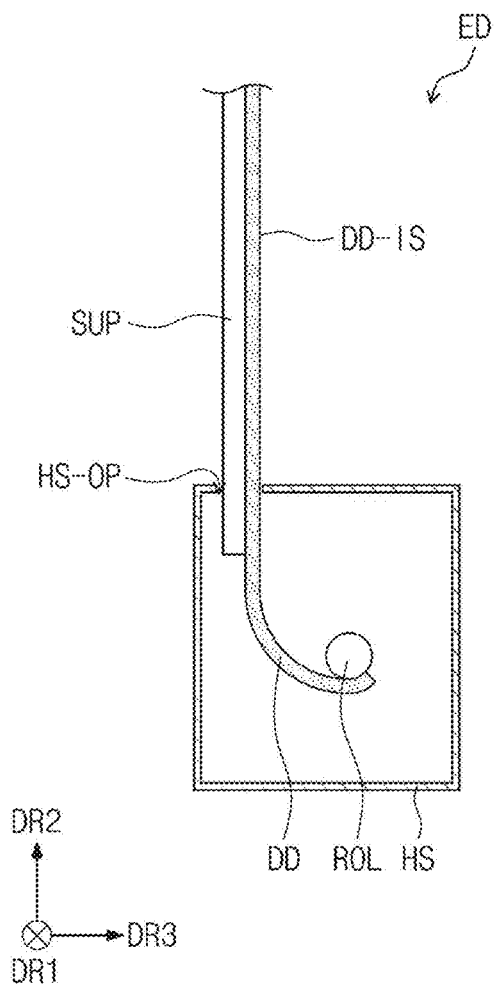
FIGS. 1A and 1B are cross-sectional views of an electronic apparatus according to some embodiments of the inventive concept.

In this specification, when an element (or a region, a layer, a portion, or the like) is referred to as "being on", "being connected to", or "being coupled to" another element, it may be directly located/connected/coupled to another element, or an intervening third element may also be located therebetween.

Like numbers refer to like elements throughout. Also, in the drawings, the thicknesses, ratios, and dimensions of the elements are exaggerated for effective description of the technical contents. "And/or" includes one or more combinations which may be defined by the associated elements.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

Hereinafter, aspects of some embodiments of the inventive concept will be described in more detail with reference to the drawings.

Figure 1B:
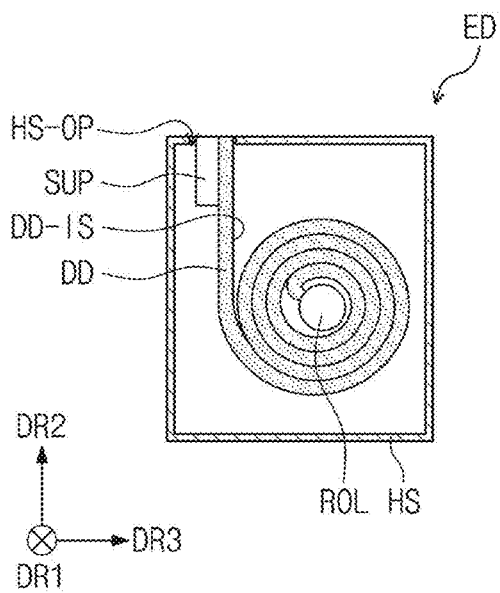

FIGS. 1A and 1B are cross-sectional views of an electronic apparatus ED according to some embodiments of the inventive concept.

FIGS. 1A and 1B illustrate a rollable television as one example of the electronic apparatus ED. FIGS. 1A and 1B illustrate the rollable television in which a large display device is used, but the embodiments of the inventive concept are not limited. For example, some embodiments of the inventive concept include small electronic apparatuses such as mobile phones in which small display devices are used.

Referring to FIGS. 1A and 1B, the electronic apparatus ED according to some embodiments of the inventive concept may include a display device DD, a mechanism structure SUP, a roller ROL, and a housing HS. The electronic apparatus ED may further include additional components according to the purposes thereof.

FIG. 1A illustrates the electronic apparatus ED in a first mode, and FIG. 1B illustrates the electronic apparatus ED in a second mode. In the first mode, the display device DD may be in an unfolded (e.g., a planar) state. In the second mode, the display device DD may be in a rolled state.

When the display device DD is completely unfolded in the first mode, at least a portion of the display device DD exposed from the housing HS may provide a planar display surface DD-IS. The display surface DD-IS in the first mode is parallel to a plane defined by a first direction axis DR1 and a second direction axis DR2. A normal direction of the display surface DD-IS, that is, a thickness direction of the display device DD is indicated as a third direction axis DR3. A front surface (or a top surface) and a rear surface (or a bottom surface) in each of members are distinguished by the third direction axis DR3. Hereinafter, first to third directions refer to the same reference symbols as the directions indicated by the first and third direction axes DR1, DR2, and DR3, respectively.

When the display device DD is completely rolled in the second mode, most of the display device DD is rolled on the roller ROL. The roller ROL has a shape extending in the first direction DR1 and serves as a rolling shaft. A motor for driving the roller ROL may be further arranged inside the housing HS.

According to some embodiments of the inventive concept, all of the display device DD is unfolded in the first mode, and approximately half of the display device DD is unfolded in the second mode. According to some embodiments, the display device DD may secure areas capable of providing images to a user irrespective of the first mode and the second mode. The display device may be used in a portable electronic apparatus such as a mobile phone.

The display device DD is configured to pass or travel in and out through an opening HS-OP of the housing HS. The mechanism structure SUP is located on the rear surface or the side surface of the display device DD and guides the display device DD which is being deformed between the first mode and the second mode. The mechanism structure SUP may include an assembly of a support frame, of which the length is gradually increased or decreased, or a multi-joint structure.

According to some embodiments of the inventive concept, stress may occur at the display device DD when the display device DD is wounded as in the second mode. The controlling of stress is a critical factor for preventing or reducing defects that occur at the display device DD. Even if stress occurs at the display device DD, a base layer and a supporter, which will be described in more detail later, may distribute the stress on the entire display device DD. Hereinafter, the base layer and the supporter will be described in more detail.

Figure 2:
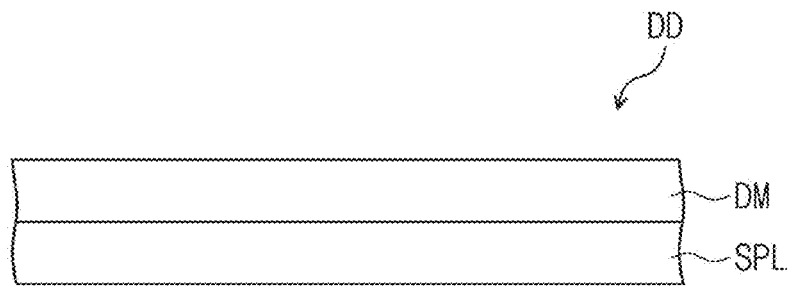
FIG. 2 is a cross-sectional view of a display device according to some embodiments of the inventive concept.
Figure 3:
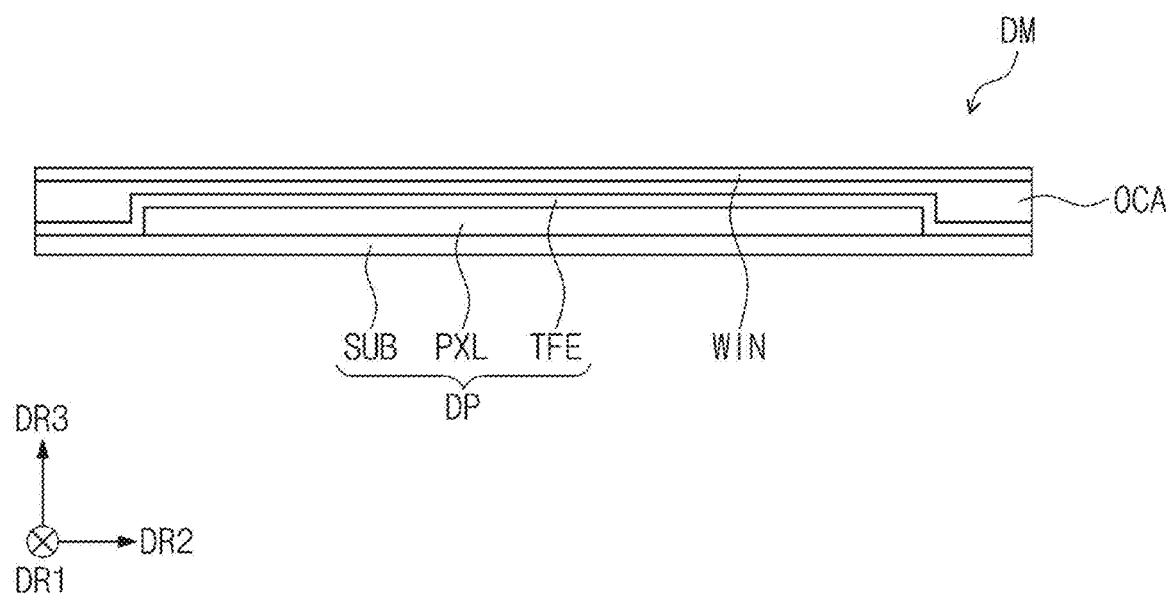
FIG. 3 is a cross-sectional view of a display panel according to some embodiments of the inventive concept.

FIG. 2 is a cross-sectional view of a display device DD according to some embodiments of the inventive concept. FIG. 3 is a cross-sectional view of a display module DM according to some embodiments of the inventive concept.

As illustrated in FIG. 2, the display device DD according to some embodiments of the inventive concept includes a display module DM and a supporter SPL. The supporter SPL is located below the display module DM. The supporter SPL may maintain the display module DM in an unfolded state when the display device DD is unfolded as illustrated in FIG. 1A.

The supporter SPL may be directly coupled to the bottom surface of the display module DM. The supporter SPL may have an elastic modulus greater than that of the display panel DP which will be described in more detail later.

As illustrated in FIG. 3, the display module DM may include a display panel DP and a window WIN. According to some embodiments of the inventive concept, the display module DM may further include at least one of an anti-reflection unit or an input sensor. The anti-reflection unit may include a polarizer or a color filter.

The window WIN protects the display panel DP and provides the physical outermost surface. The window WIN may include a glass or plastic film. In FIG. 3, the window WIN coupled to the display panel DP by an adhesive member is illustrated as an example. The adhesive layer OCA may include a general adhesive or bonding agent, but embodiments according to the present disclosure are not particularly limited.

The display panel DP generates or displays images. The display panel DP according to some embodiments of the inventive concept may be a light emitting display panel, but embodiments are not particularly limited thereto. For example, the display panel DP may be an organic light emitting display panel or an inorganic light emitting display panel. A light emitting layer of the organic light emitting display panel may include an organic light emitting material. A light emitting layer of the inorganic light emitting display panel may include quantum dots, quantum rods, inorganic LEDs, or the like. Hereinafter, the display panel DP is described as the organic light emitting display panel.

The display panel DP may include a base layer SUB, a pixel layer PXL located on the base layer SUB, and an encapsulation layer TFE located on the base layer SUB so as to cover the pixel layer PXL. The pixel layer PXL may include a plurality of pixels, and each of the pixels may include a pixel driving circuit and a light emitting element. The pixels may emit light toward the encapsulation layer TFE.

The encapsulation layer TFE protect the pixels. The encapsulation layer TFE may include at least two inorganic layers and an organic layer located between the inorganic layers. The inorganic layers include an inorganic material, and may protect the pixel layer PXL against moisture/oxygen. The organic layer includes an organic material, and may protect the pixel layer PXL against foreign substances such as dust particles.

Figure 4A:
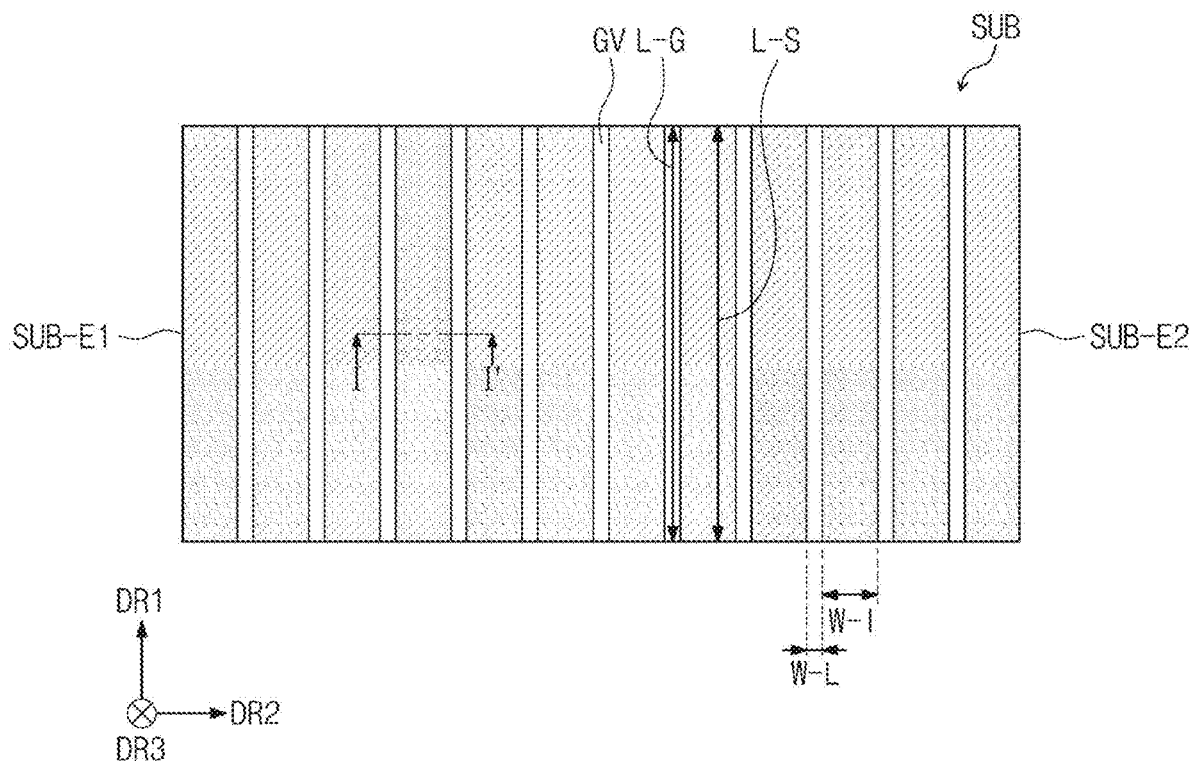
FIG. 4A is a plan view of a base layer according to some embodiments of the inventive concept.
Figure 4B:
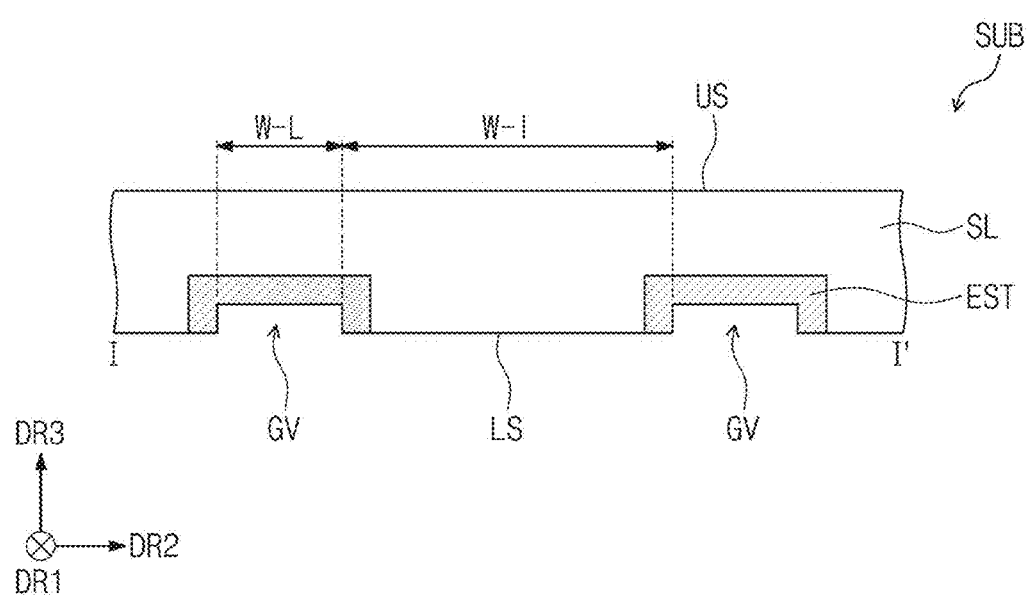
FIG. 4B is a cross-sectional view of a base layer according to some embodiments of the inventive concept.
Figure 5A:
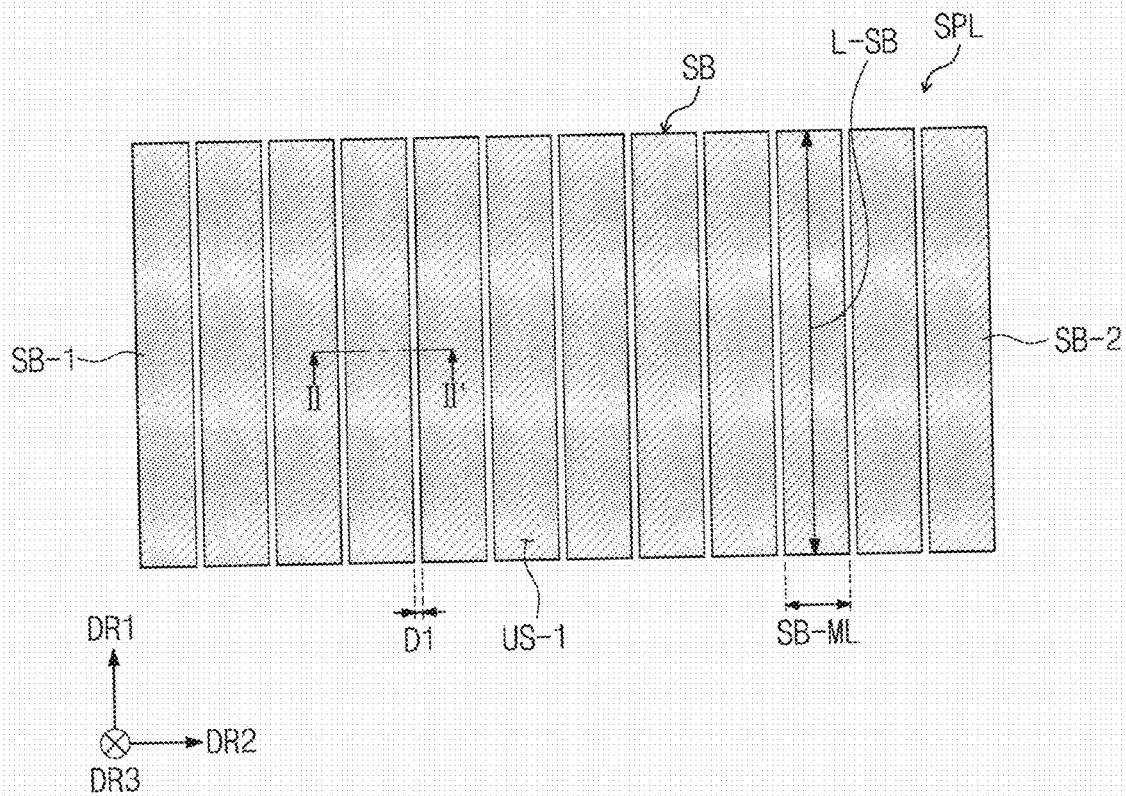
FIG. 5A is a plan view of a supporter according to some embodiments of the inventive concept.
Figure 5B:
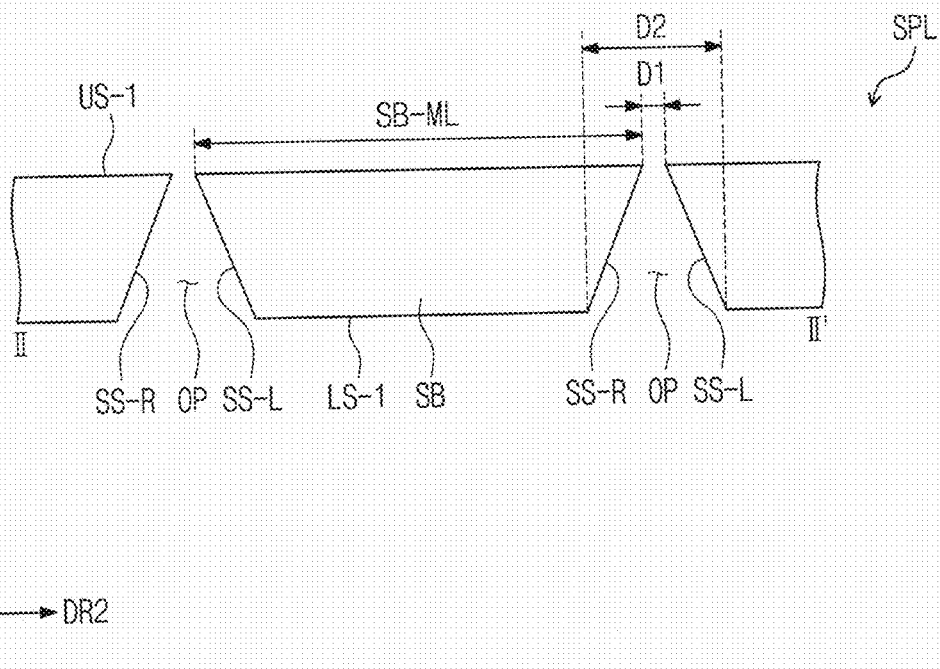
FIG. 5B is a cross-sectional view of a supporter according to some embodiments of the inventive concept.
Figure 6:
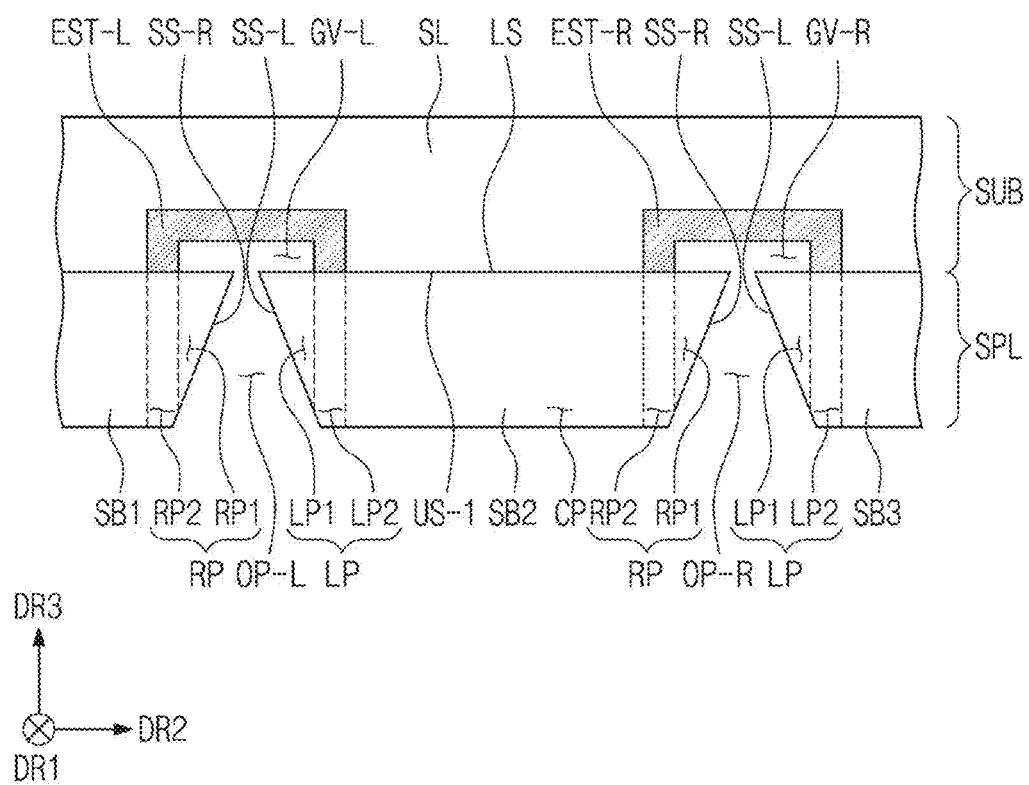
FIG. 6 is a cross-sectional view of a base layer and a supporter, which are coupled to each other, in a display device according to some embodiments of the inventive concept.

FIG. 4A is a plan view of a base layer SUB according to some embodiments of the inventive concept. FIG. 4B is a cross-sectional view of a base layer SUB according to some embodiments of the inventive concept. FIG. 5A is a plan view of a supporter SPL according to some embodiments of the inventive concept. FIG. 5B is a cross-sectional view of a supporter SPL according to some embodiments of the inventive concept. FIG. 6 is a cross-sectional view of a base layer SUB and a supporter SPL, which are coupled to each other, in a display device according to some embodiments of the inventive concept.

FIG. 4B illustrates a cross-section corresponding to the line I-I' of FIG. 4A, and the FIG. 5B illustrates a cross-section corresponding to the line II-II' of FIG. 5A. FIG. 6 illustrates a cross-section in which the base layer SUB of FIGS. 4A and 4B is coupled to the supporter SPL of FIGS. 5A and 5B.

As illustrated in FIG. 4A, a plurality of grooves GV may be defined in the base layer SUB. Each of the plurality of grooves GV may extend in a first direction DR1, and the plurality of grooves GV are arrayed in a second direction DR2. The plurality of grooves GV may be arranged while spaced apart from each other in the second direction DR2. In the first direction DR1, a length L-G of each of the plurality of grooves GV may be substantially the same as a length L-S of the base layer SUB.

As illustrated in FIG. 4A, in the second direction DR2, the base layer SUB includes one end SUB-E1 and the other end SUB-E2 which correspond to one end and the other end of the display panel DP.

The plurality of grooves GV may have substantially the same length L-G and substantially the same width W-L. The plurality of grooves GV may be spaced substantially the same gap W-I from each other. Herein, being "substantially the same" means that process errors occurring during the formation of the grooves GV in the fabrication process of the display device, which will be described later, are ignored.

As illustrated in FIG. 4B, the base layer SUB may include a flat top surface US and a bottom surface LS in which the grooves GV are defined. The pixel layer PXL, which has been described with reference to FIG. 3, is formed on the flat top surface US. The grooves GV formed in the bottom surface LS may correspond to spaces in which sacrificial layers removed during the fabrication process have been arranged. This will be described later in detail.

The base layer SUB may include a plurality of stopper patterns EST and a support layer SL. The groove GV is located in each of the plurality of stopper patterns EST. The plurality of stopper patterns EST may be spaced a certain distance from each other in the second direction DR2. The stopper pattern EST and the groove GV, which correspond to each other, may have the same length in the first direction DR1.

The support layer SL covers the plurality of stopper patterns EST and physically connects the plurality of stopper patterns EST. The support layer SL may be directly coupled to the plurality of stopper patterns EST or coupled thereto through an adhesive layer. The plurality of grooves are defined in the support layer SL, and the stopper pattern EST is located in each of the plurality of grooves.

As illustrated in FIG. 5A, the supporter SPL includes a plurality of support blocks SB spaced apart from each other. Each of the plurality of support blocks SB extends in the first direction DR1. The plurality of support blocks SB may have substantially the same length L-SB in the first direction DR1. The plurality of support blocks SB may have substantially the same width SB-ML on a top surface US-1 of the plurality of support blocks SB. The plurality of support blocks SB may have the maximum width SB-ML on the top surface US-1.

The supporter SPL may support the entire display panel DP (see FIG. 3). A first outer support block SB-1 located closest to the one side among the plurality of support blocks SB may support the one end SUB-E1 (see FIG. 4A) of the base layer SUB, and a second outer support block SB-2 located closest to the other side may support the other end SUB-E2 (see FIG. 4A) of the base layer SUB.

As illustrated in FIG. 5B, each of the plurality of support blocks SB may include a flat top surface US-1 and a flat bottom surface LS-1. For example, the top surfaces US-1 of the plurality of support blocks SB correspond to a support surface that contacts the base layer SUB. Referring to FIG. 6, the top surfaces US-1 of support blocks SB1, SB2, and SB3 support the bottom surface LS of the base layer SUB.

Referring to FIG. 5B, a space between the neighboring support blocks SB among the plurality of support blocks SB may be an etched region. In other words, a region, in which a portion of the supporter SPL is removed during the formation of the grooves GV in the fabrication process of the display device which will be described later, corresponds to the space between the neighboring support blocks SB. In the point of view with respect to the supporter SPL, the space between the support blocks SB may correspond to an opening OP of the supporter SPL which passes through the supporter SPL. Each of the support blocks SB may include a first side surface SS-L and a second side surface SS-R.

The first side surface SS-L and the second side surface SS-R of the neighboring support blocks SB face each other and define the opening OP. The gap between the first side surface SS-L and the second side surface SS-R of the neighboring support blocks SB may increase from the top surface US-1 to the bottom surface LS-1. The minimum gap between the neighboring support blocks SB on an extension line of the top surfaces US-1 of the neighboring support blocks SB is illustrated as a first distance D1, and the maximum gap between the neighboring support blocks SB on an extension line of the bottom surface LS-1 of the support blocks SB is illustrated as a second distance D2. The gap between the first side surface SS-L and the second side surface SS-R of the neighboring support blocks SB increases in a direction away from the top surface US-1. This is because each of the first side surface SS-L and the second side surface SS-R is inclined to form an acute angle with respect to the top surface US-1 and form an obtuse angle with respect to the bottom surface LS-1. The gap between the first side surface SS-L and the second side surface SS-R of the neighboring support blocks SB relates to the fabrication process, and this will be described later in more detail.

FIG. 6 illustrates a first support block SB1, a second support block SB2, and a third support block SB3 among the plurality of support blocks SB (see FIG. 5A). The first support block SB1, the second support block SB2, and the third support block SB3 may be directly coupled to the bottom surface of the base layer SUB. Like the second support block SB2 illustrated in FIG. 6, most of the plurality of support blocks SB (see FIG. 5A) overlap two grooves GV-L and GV-R positioned on both sides. According to some embodiments, only the first outer support block SB-1 and the second outer support block SB-2 illustrated in FIG. 5A may overlap one groove. Hereinafter, the second support block SB2 will be mainly described.

FIG. 6 illustrates a first stopper pattern EST-L, in which a first groove GV-L is defined, and a second stopper pattern EST-R, in which a second groove GV-R is defined. The first stopper pattern EST-L is located on the left side of the second support block SB2, and the second stopper pattern EST-R is located on the right side of the second support block SB2.

The second support block SB2 may be divided into a plurality of portions when viewed in a plan view. The second support block SB2 may include a portion LP overlapping the first stopper pattern EST-L when viewed in a plan view, a portion RP overlapping the second stopper pattern EST-R, and a portion CP not overlapping the first stopper pattern EST-L and the second stopper pattern EST-R.

With respect to the second support block SB2, the portion LP overlapping the first stopper pattern EST-L is defined as a first portion, and the portion RP overlapping the second stopper pattern EST-R is defined as a second portion. The portion CP not overlapping the first stopper pattern EST-L and the second stopper pattern EST-R is defined as a third portion. The first portion LP may include a spaced portion LP1 overlapping the first groove GV-L and a support portion LP2 not overlapping the first groove GV-L, and the second portion RP may include a spaced portion RP1 overlapping the second groove GV-R and a support portion RP2 not overlapping the second groove GV-R.

Each of the first support block SB1, the second support block SB2, and the third support block SB3 includes two portions which respectively overlap two neighboring stopper patterns EST-L and EST-R. When one of the two portions is referred to as the first portion, the other one may be defined as the second portion. In other words, it may be considered that the first portion LP of the second support block SB2 and the second portion RP of the first support block SB1 in the second direction DR2 overlap the first stopper pattern EST-L.

The first portion LP of the second support block SB2 and the second portion RP of the second support block SB2 may include at least portions of the side surfaces SS-L and SS-R. In FIG. 6, the first portion LP of the second support block SB2 includes the entirety of the inclined first side surface SS-L, and the second portion RP of the second support block SB2 includes the entirety of the inclined second side surface SS-R. Each of the first portion LP of the second support block SB2 and the second portion RP of the second support block SB2 may include an area of the top surface US-1 which is exposed from the corresponding grooves GV-L and GV-R.

Referring to FIG. 6, a first area of the top surface US-1 of the second support block SB2 corresponds to the top surface of the first portion LP of the second support block SB2. A second area of the top surface US-1 of the second support block SB2 corresponds to the top surface of the second portion RP of the second support block SB2. An area corresponding to the spaced portion LP1 in the first area of the top surface US-1 of the second support block SB2 is spaced apart from the base layer SUB by the first groove GV-L, and an area corresponding to the spaced portion RP1 in the second area of the top surface US-1 of the second support block SB2 is spaced apart from the base layer SUB by the second groove GV-R. The top surface US-1 of the second support block SB2 is in contact with the neighboring first and second stopper patterns EST-L and EST-R and the support layer SL. Because the bottom surface LS of the support layer SL is directly coupled to the top surface US-1 of the second support block SB2, these surfaces may be substantially the same.

The width of the second support block SB2 measured along the second direction DR2 on the top surface US-1 of the second support block SB2 is greater than a gap between the second support block SB2 and each of the support blocks SB1 and SB3 adjacent thereto. The surface area may be secured so that the second support block SB2 sufficiently supports the base layer SUB.

Openings OP-L and OP-R between the support blocks SB1, SB2, and SB3 may be continuously connected to the grooves GV-L and GV-R. End portions, in the second direction DR2, on both sides of each of the support blocks SB1, SB2, and SB3 are physically free from the base layer SUB by the grooves GV-L and GV-R.

The widths of the grooves GV-L and GV-R measured along the second direction DR2 on the top surface US-1 of the second support block SB2 are greater than the gaps, which overlap the respective grooves, between the neighboring support blocks SB1, SB2, and SB3. The width, which is measured along the second direction DR2, of each of the first and second stopper patterns EST-L and EST-R providing the grooves GV-L and GV-R is also greater than the gap between the neighboring support blocks SB1, SB2, and SB3.

The first and second stopper patterns EST-L and EST-R may prevent or reduce deformation of the support layer SL due to external pressure (for example, pressure applied when the adhesive layer OCA (see FIG. 3) is attached onto the base layer SUB). This is because each of the first and second stopper patterns EST-L and EST-R has a modulus greater than that of the support layer SL. The first and second stopper patterns EST-L and EST-R may prevent or reduce instances of the support layer SL being pressed into the spaces between the neighboring support blocks SB1, SB2, and SB3 by the pressure applied from above.

Figure 7A:
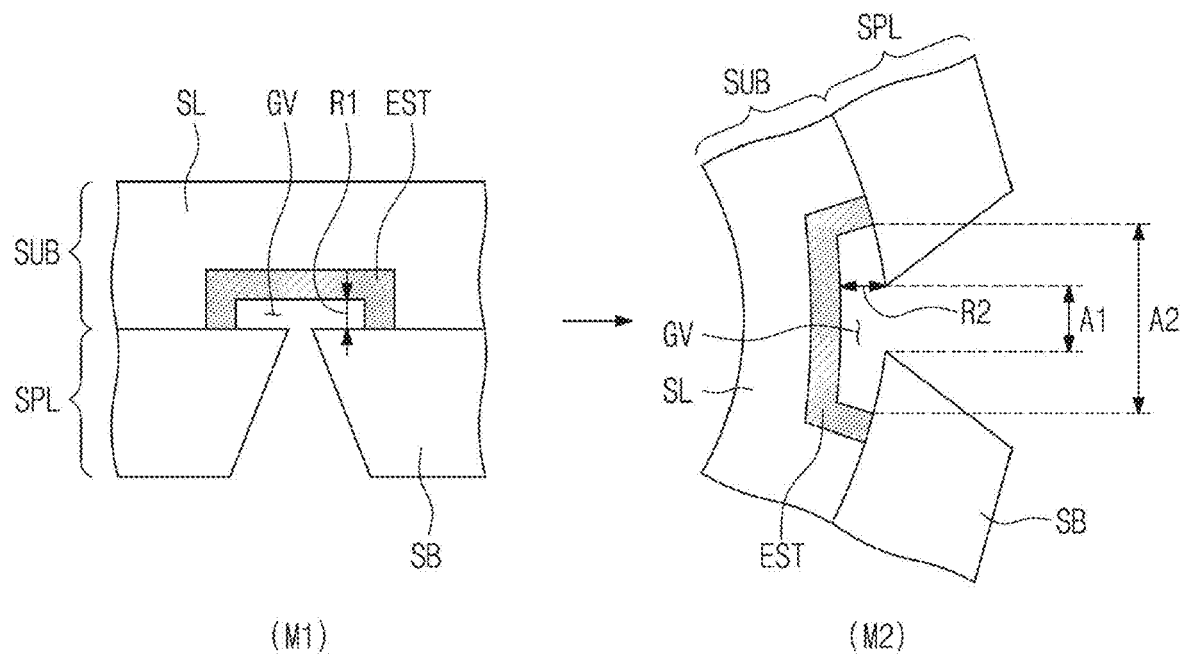
FIG. 7A is a cross-sectional view illustrating deformation of a supporter with respect to a base layer according to operation mode of a display device according to some embodiments of the inventive concept.

FIG. 7A is a cross-sectional view illustrating deformation of a supporter with respect to a base layer according to operation mode of a display device according to some embodiments of the inventive concept. FIG. 7A is a cross-sectional view illustrating deformation of a supporter with respect to a base layer according to operation mode of a display device according to a comparative example.

As illustrated in FIG. 7A, as a display device DD is deformed from a first mode M1 to a second mode M2, the deformation of the supporter SPL with respect to the base layer SUB occurs.

The stress does not occur at the base layer SUB and the supporter SPL in the first mode M1, but as the display device DD is converted into the second mode M2, the tensile stress occurs at the base layer SUB.

A distance R2 between the bottom surface of the base layer SUB within a groove GV and the top surface of a support block SB in the second mode M2 becomes greater than a distance R1 between the bottom surface of the base layer SUB within the groove GV and the top surface of the support block SB in the first mode M1.

The stress to be concentrated on an area A1 of a support layer SL between neighboring support blocks SB, particularly, on points of the support layer SL corresponding to edges of the support blocks SB is distributed to an area A2 corresponding to the width of a stopper pattern (or the width of the groove). As the stress is distributed, defects that occur at the display panel DP when rolled may be reduced or prevented.

Figure 7B:
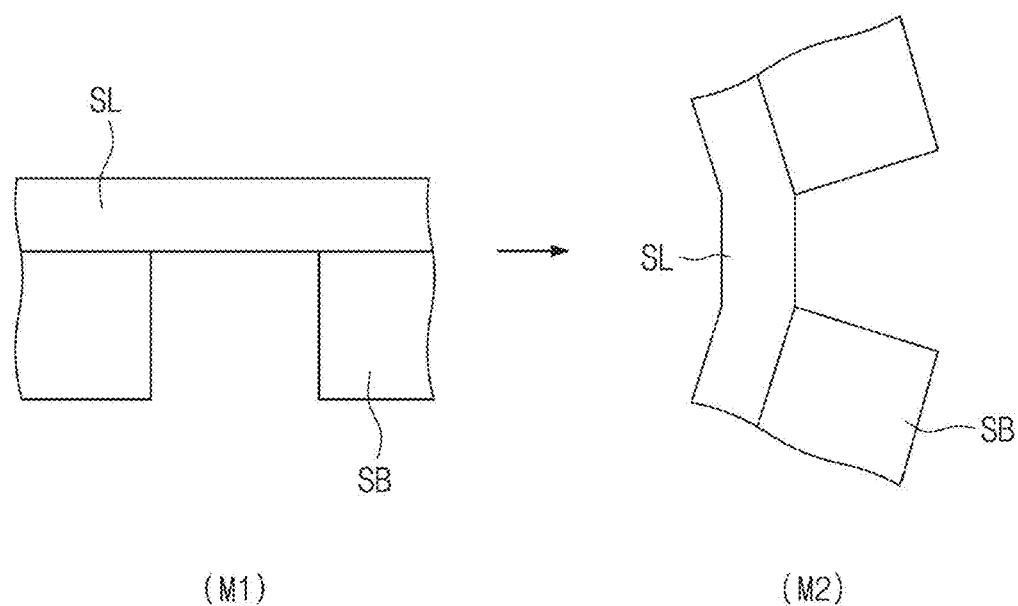
FIG. 7B is a cross-sectional view illustrating deformation of a supporter with respect to a base layer according to operation mode of a display device.

According to the comparative example illustrated in FIG. 7B, stress is concentrated on points of a support layer SL corresponding to edges of support blocks SB. Accordingly, defect in which the support layer SL is sharply bent in a second mode M2 may occur.

FIGS. 8A to 8G are cross-sectional views illustrating a fabrication method of a display device DD according to some embodiments of the inventive concept. FIGS. 8A to 8G are illustrated on the basis of the cross-section corresponding to FIG. 6.

Figure 8A:
FIGS. 8A to 8G are cross-sectional views illustrating a fabrication method of a display device according to some embodiments of the inventive concept.
Figure 8A:
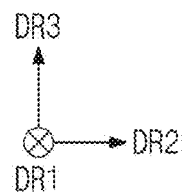

As illustrated in FIG. 8A, a support substrate SPL-P is provided. The support substrate SPL-P corresponds to a base substrate for forming a display device. The support substrate SPL-P may be a substrate which may be dry-etched or wet-etched. According to some embodiments, the support substrate SPL-P may be a glass substrate.

Figure 8B:
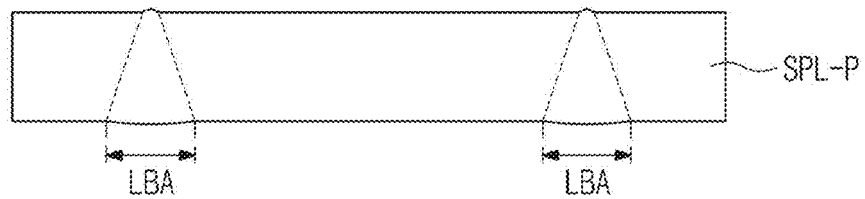
Figure 8B:
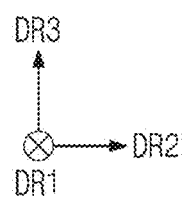

As illustrated in FIG. 8B, some areas of the support substrate SPL-P are irradiated with laser beams. The ultra-short pulse laser may be used. A plurality of laser irradiation areas LBA may be formed in the support substrate SPL-P. Each of the plurality of laser irradiation areas LBA extends in a first direction DR1, and the plurality of laser irradiation areas LBA are spaced apart from each other and arrayed in a second direction DR2.

The laser irradiation areas LBA may correspond to areas to be substantially etched (hereinafter, referred to as etching areas). The laser irradiation area LBA has a relatively higher etch rate than a laser non-irradiation area, and thus, a larger amount of the laser irradiation area LBA is removed relatively faster in an etching process which will be described in more detail later.

FIG. 8B illustrates an example in which the bottom surface of the support substrate SPL-P is irradiated with the laser beams. When viewed in a cross-sectional view, the width of the laser irradiation area LBA in the second direction DR2 may increase in a direction toward the bottom surface of the support substrate SPL-P.

The top surface of the support substrate SPL-P may be irradiated with the laser beams, or both the top surface and the bottom surface of the support substrate SPL-P may be irradiated with the laser beams. According to the irradiation directions of the laser beams, the cross-sectional areas of the laser irradiation area LBA may be varied.

Figure 8C:
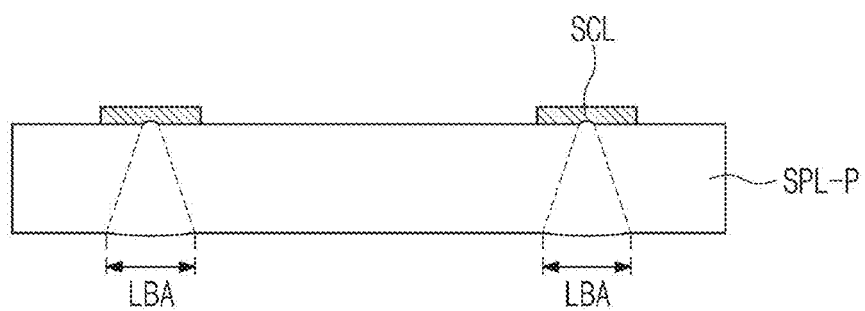
Figure 8C:
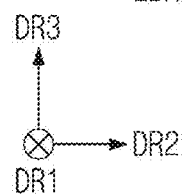

As illustrated in FIG. 8C, a plurality of sacrificial patterns SCL overlapping the laser irradiation areas LBA are formed on one surface of the support substrate SPL-P. Two sacrificial patterns SCL formed on the top surface of the support substrate SPL-P are illustrated as an example.

Materials having similar etching properties to the support substrate SPL-P are selected for the sacrificial patterns SCL. According to some embodiments, each of the sacrificial patterns SCL may include a silicon oxide, a silicon nitride, or a silicon oxynitride having the similar etching properties to glass.

The sacrificial pattern SCL extends in the first direction DR1 and is located on the top surface of the support substrate SPL-P so as to cover the laser irradiation area LBA.

Figure 8D:
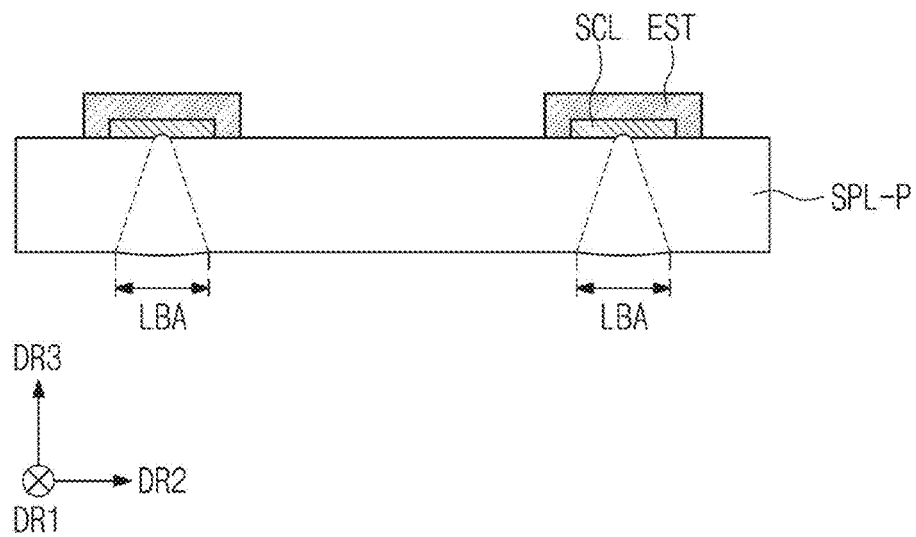

As illustrated in FIG. 8D, a plurality of stopper patterns EST respectively overlapping the sacrificial patterns SCL are formed on the top surface of the support substrate SPL-P. Materials strongly resistant to etching materials may be selected for the stopper patterns EST. Materials having higher elastic modulus than a support layer, which will be described in more detail later, may be selected for the stopper patterns EST.

According to some embodiments, the stopper patterns EST may include metals. The stopper patterns EST may include molybdenum or tungsten.

Each of the plurality of stopper patterns EST encloses the corresponding sacrificial pattern among the sacrificial patterns SCL. The plurality of stopper patterns EST are in contact with the top surface of the support substrate SPL-P. The plurality of stopper patterns EST having the above shape may prevent or reduce instances of an etching solution being delivered to the outside of the stopper pattern EST in an etching process which will be described in more detail later.

Figure 8E:
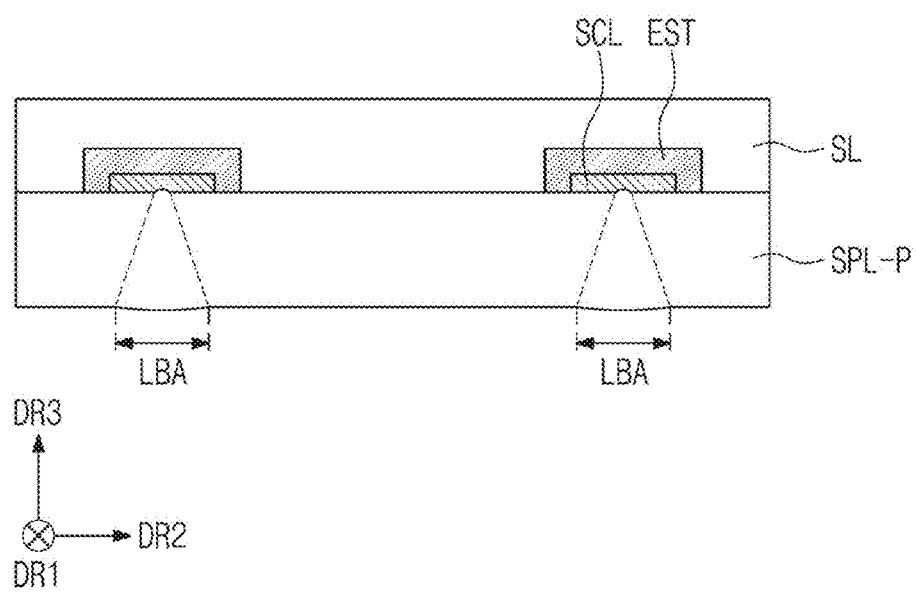

As illustrated in FIG. 8E, a support layer SL for covering the stopper patterns EST is formed on the top surface of the support substrate SPL-P. The support layer SL may include a synthetic resin. The synthetic resin may be formed through a spin coating or inkjet printing method. The synthetic resin layer may provide a flat top surface.

Figure 8F:
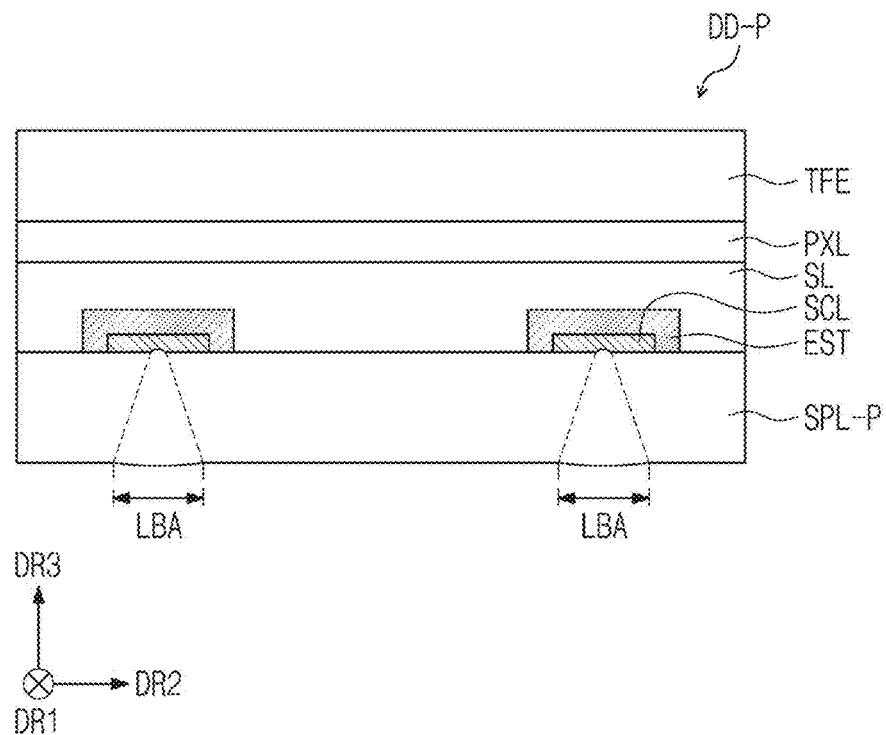

Subsequently, as illustrated in FIG. 8F, a pixel layer PXL and an encapsulation layer TFE are formed on the support layer SL, and accordingly, a preliminary-display device DD-P is formed. The forming process of the pixel layer PXL may include processes of forming a metal layer and patterning the metal layer, and may include processes of forming a semiconductor layer and patterning the semiconductor layer. The forming process of the encapsulation layer TFE may include a deposition process of an inorganic material and a deposition process of an organic material. A method for forming the pixel layer PXL and the encapsulation layer TFE may be performed through a general forming method of a display device, and thus, some detailed description thereof may be omitted. According to some embodiments, a protection layer for protecting the pixel layer PXL and the encapsulation layer TFE against an etching process which will be described in more detail later may be further formed on the top surface of the encapsulation layer TFE.

Subsequently, the preliminary-display device DD-P is etched. Wet etch or dry etch may be performed. The wet etch is performed in a manner in which the preliminary-display device DD-P is immersed in an etching solution including hydrogen fluoride.

The laser irradiation areas LBA of the support substrate SPL-P are removed by the etching process, and then, the sacrificial patterns SCL are removed. According to some embodiments, the etching may be performed on wider areas than the laser irradiation areas LBA. However, this areas are smaller than the laser irradiation areas LBA, and thus, the areas additionally etched according to some embodiments may be ignored.

Figure 8G:
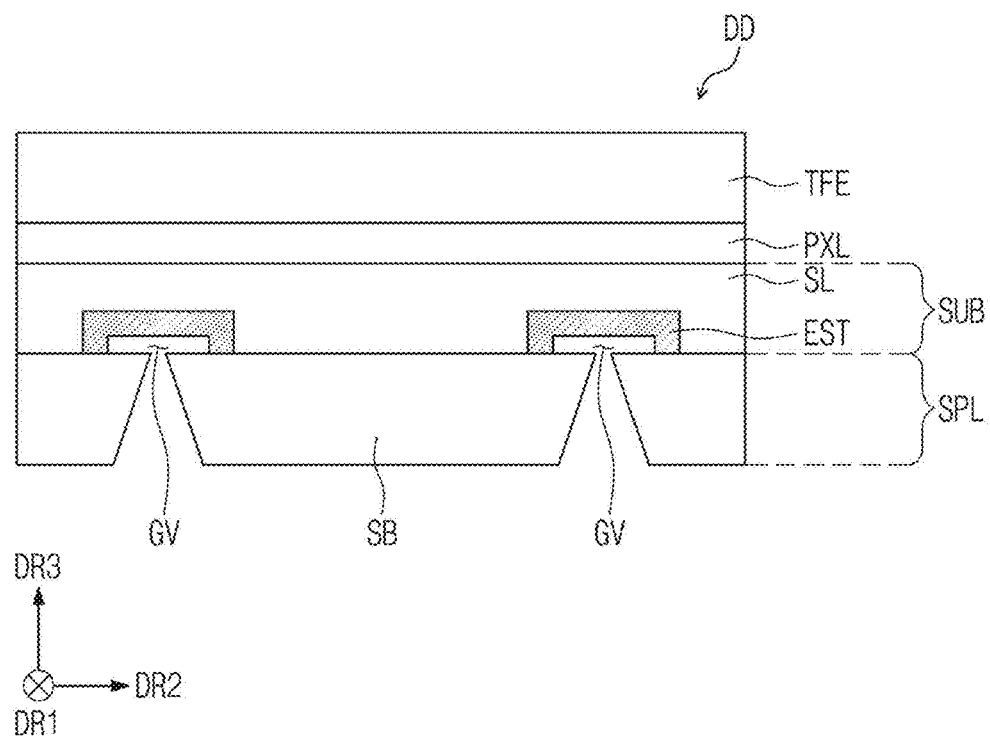

As a result of the etching, a display device DD illustrated in FIG. 8G may be fabricated. Support blocks SB are formed from the support substrate SPL-P. A space between the support blocks SB extends to a groove GV.

Figure 9:
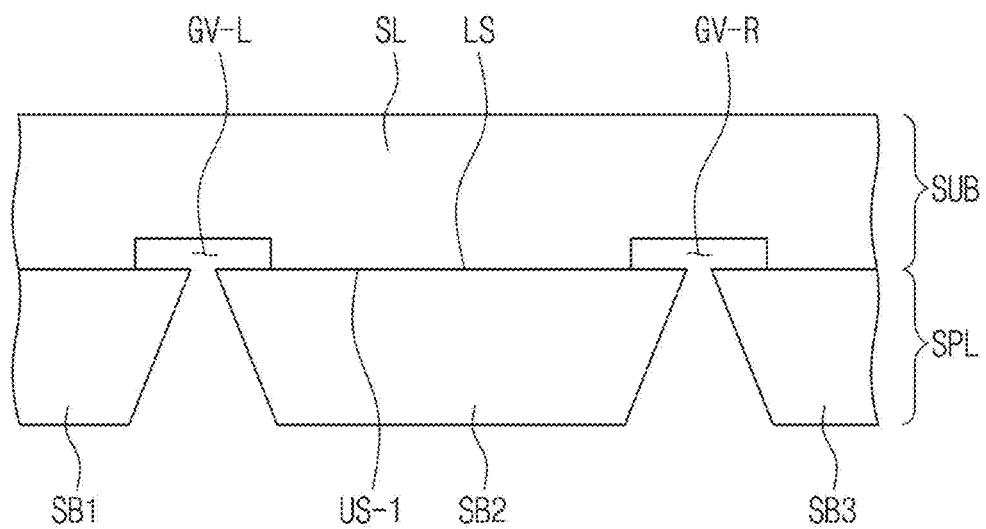
FIG. 9 is a cross-sectional view of a supporter coupled to a base layer of a display device according to some embodiments of the inventive concept.

FIG. 9 is a cross-sectional view of a supporter SPL coupled to a base layer SUB of a display device DD according to some embodiments of the inventive concept. Hereinafter, some detailed description of the same components as those described with reference to FIGS. 1A to 8G may be omitted.

As illustrated in FIG. 9, the base layer SUB may include a support layer SL. Unlike the base layer SUB illustrated in FIG. 6, the stopper patterns EST may be omitted. A plurality of grooves GV may be formed in the support layer SL. The support layer SL made of an organic material has relatively strong resistance to hydrogen fluoride, and thus, may not be damaged during the etching described with reference to FIGS. 8F to 8G.

In a fabrication process of the base layer SUB illustrated in FIG. 9, the forming process of the stopper patterns EST illustrated in FIG. 8D may be omitted. After sacrificial patterns SCL are formed, the support layer SL for covering the sacrificial patterns SCL may be immediately formed on the top surface of a support substrate SPL-P.

Figure 10A:
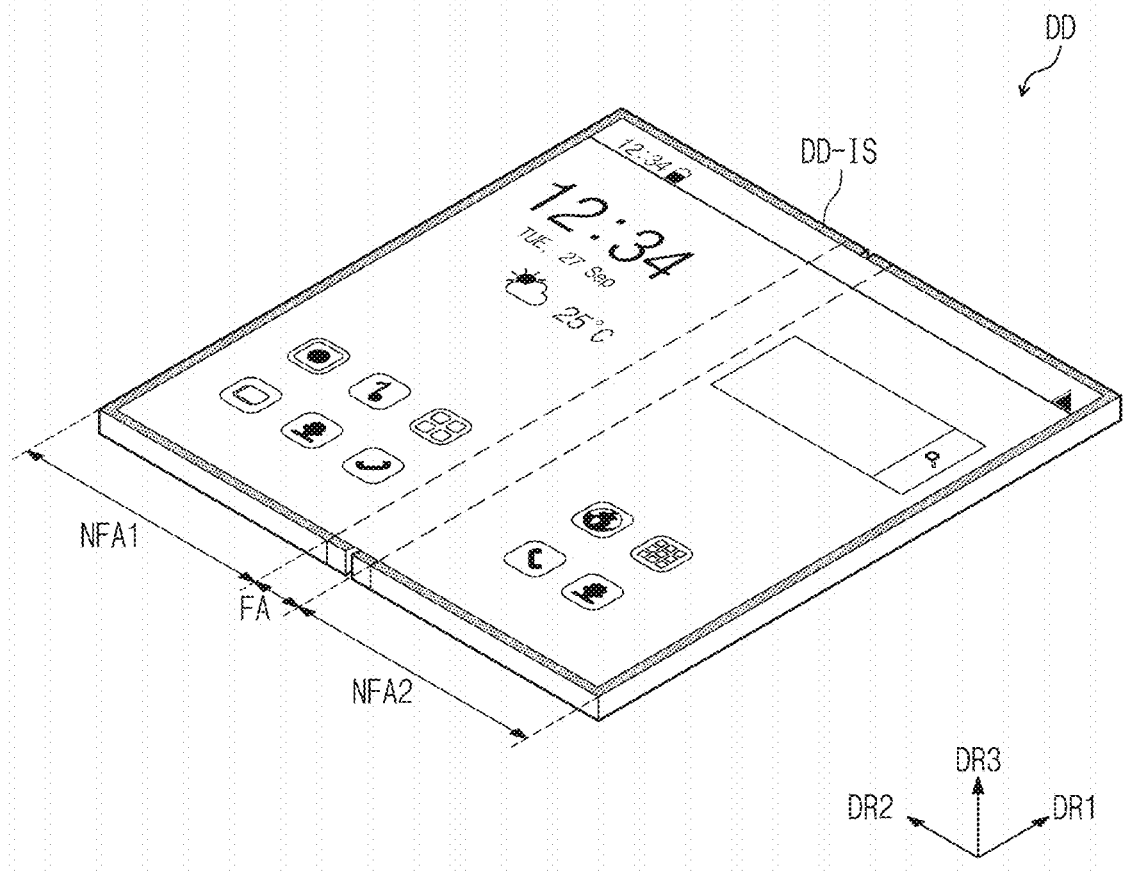
FIGS. 10A and 10B are perspective views of a display device according to some embodiments of the inventive concept.
Figure 10B:
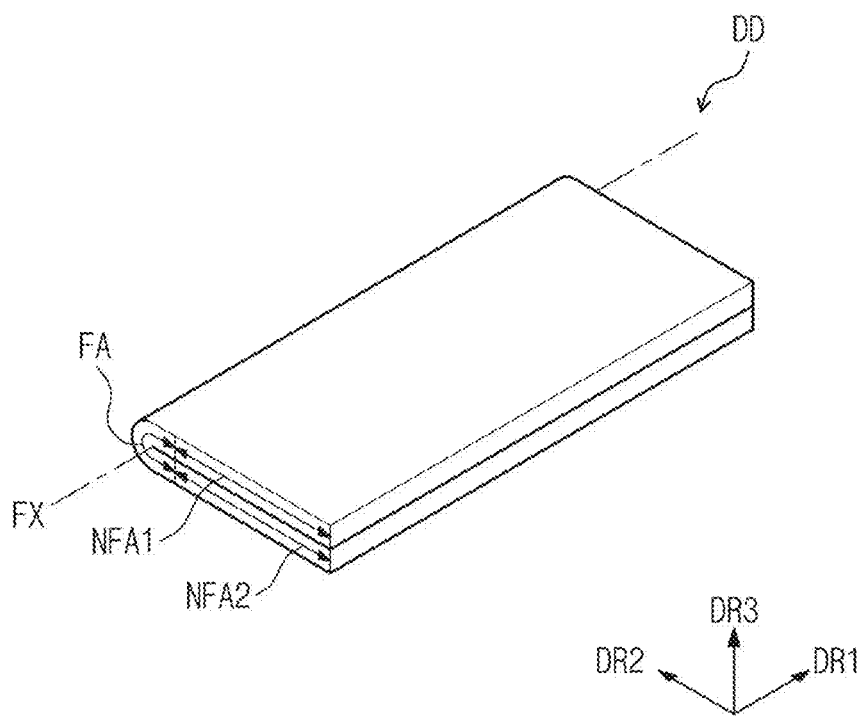
Figure 11A:
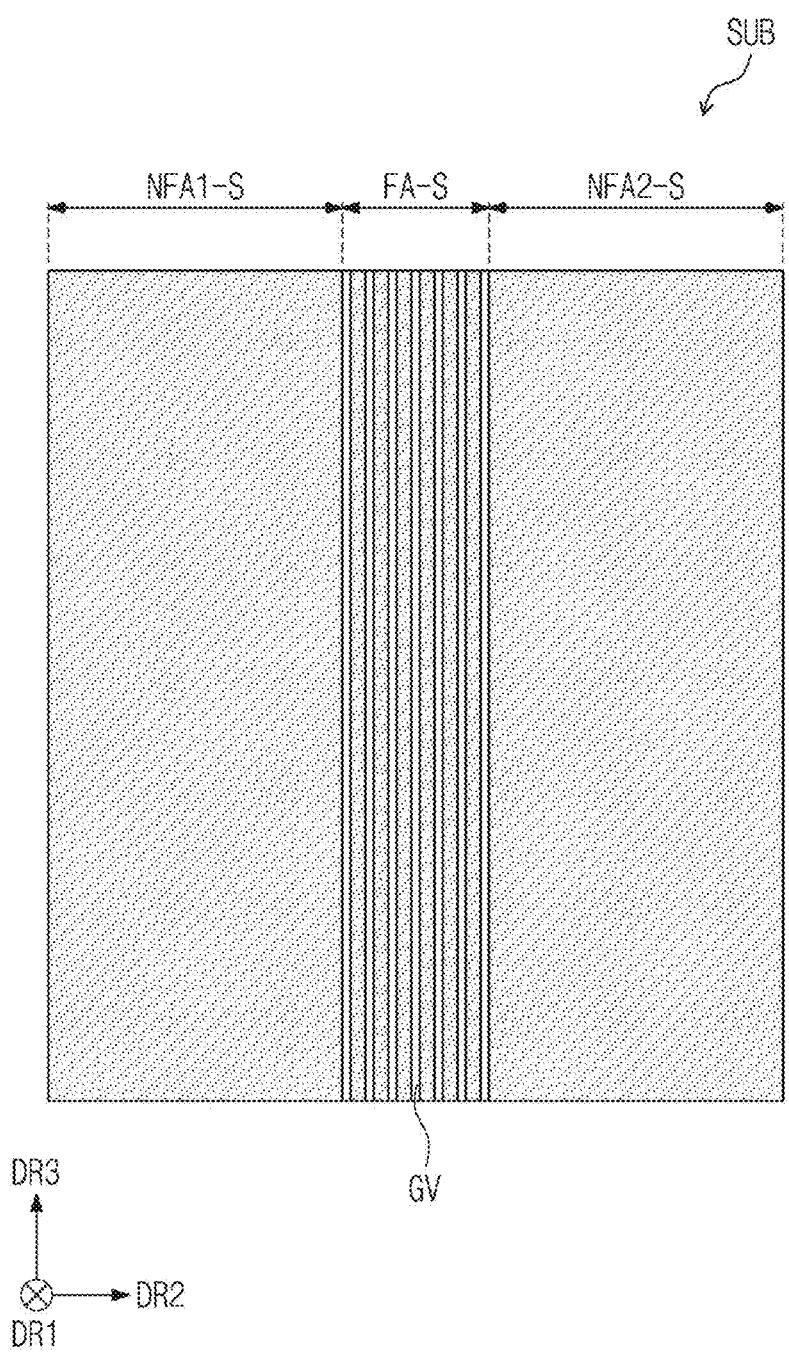
FIG. 11A is a plan view of a base layer according to some embodiments of the inventive concept.
Figure 11B:
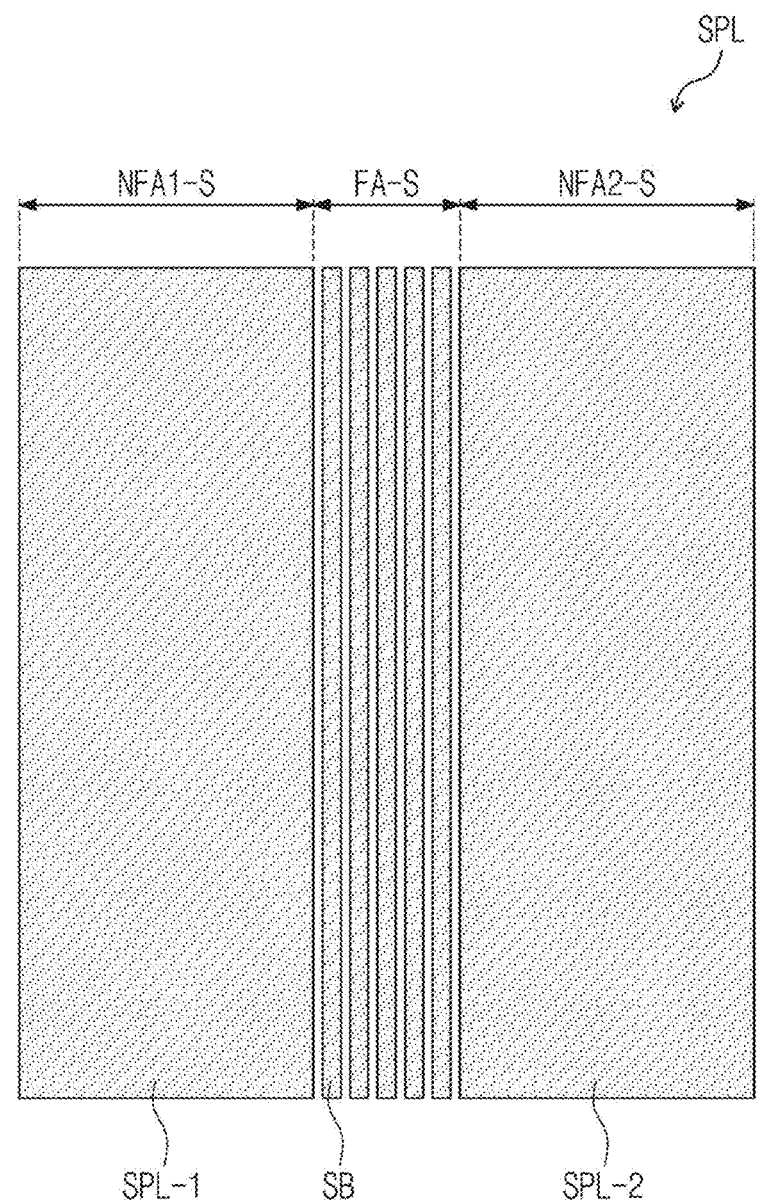
FIG. 11B is a plan view of a supporter according to some embodiments of the inventive concept.
Figure 11C:
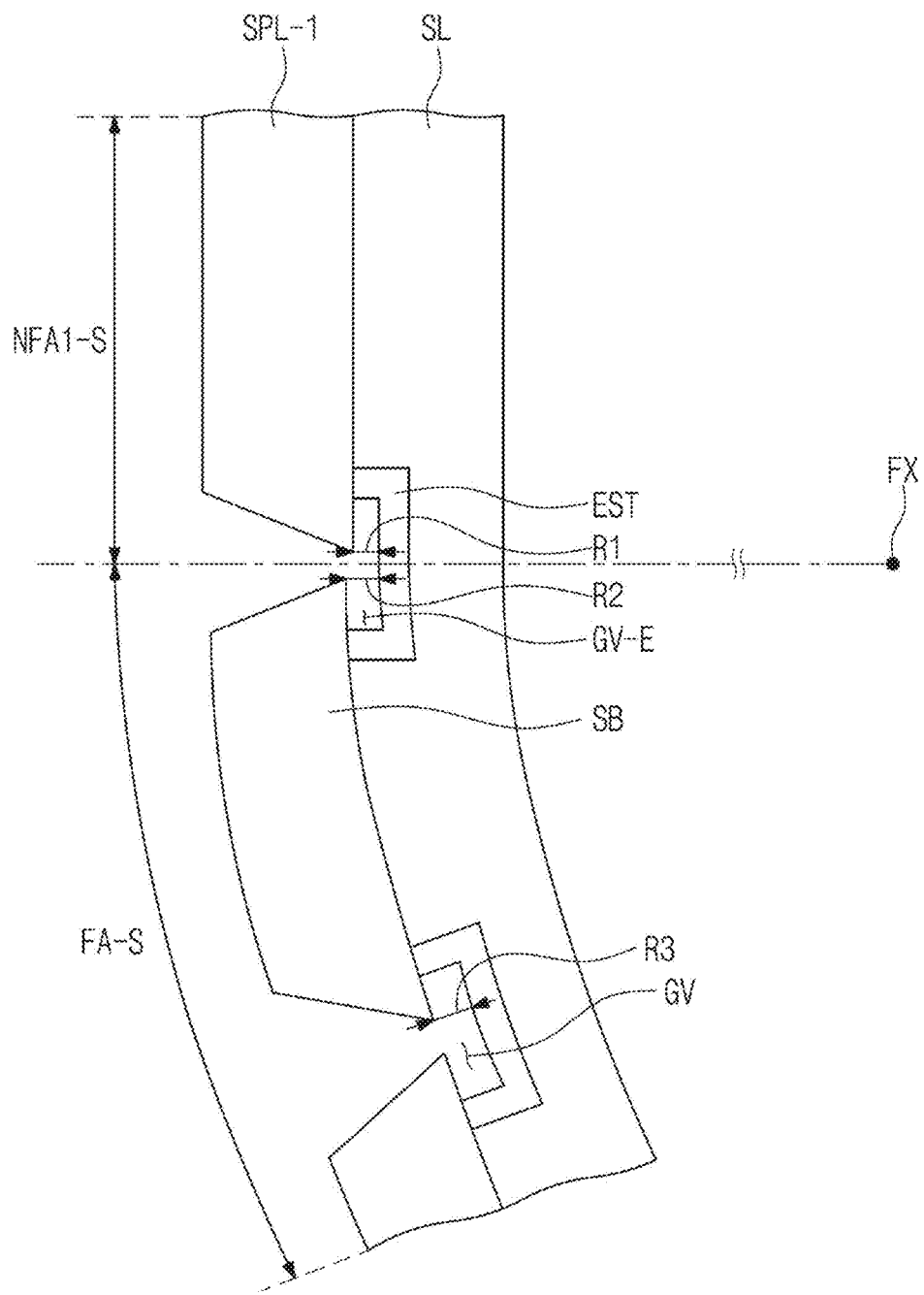
FIG. 11C is a cross-sectional view illustrating deformation of the supporter with respect to the base layer in a state in which the display device according to some embodiments of the inventive concept is folded.

FIGS. 10A and 10B are perspective views of a display device DD according to some embodiments of the inventive concept. FIG. 11A is a plan view of a base layer SUB according to some embodiments of the inventive concept. FIG. 11B is a plan view of a supporter SPL according to some embodiments of the inventive concept. FIG. 11C is a cross-sectional view illustrating deformation of the supporter SPL with respect to the base layer SUB in a state in which the display device DD according to some embodiments of the inventive concept is folded.

FIGS. 10A and 10B illustrate the foldable display device DD as one example of a flexible display device. FIG. 10A illustrates a state (a first mode) in which the foldable display device DD is unfolded (e.g., in a planar state). FIG. 10B illustrates a state (a second mode) in which the foldable display device DD is folded.

The display device DD may include a folding area FA, which is folded with respect to a folding axis FX, and a first planar area NFA1 and a second planar area NFA2, which are adjacent to the folding area FA. According to some embodiments, the folding axis FX may be parallel to a first direction axis DR1. The folding area FA may be an area that substantially forms curvature. The folding area FA may provide a curved display surface DD-IS in the second mode. According to some embodiments, the display device DD, in which the folding axis FX parallel to a long axis of the display device DD is defined, is illustrated as an example. However, the embodiments of the inventive concept are not limited, and according to some embodiments the folding axis FX may be parallel to a short axis of the display device DD.

As illustrated in FIGS. 10 and 10B, the display device DD may be inner-folded or inner-bent so that a display surface DD-IS of the first planar area NFA1 faces a display surface DD-IS of the second planar area NFA2. According to some embodiments of the inventive concept, the display device DD may be outer-folded or outer-bent so that the display surface DD-IS is exposed to the outside.

Referring to FIG. 11A, the base layer SUB includes a folding area FA-S, which is folded, and a first planar area NFA1-S and a second planar area NFA2-S, which are located on one side and the other side of the folding area FA-S in a second direction DR2. A plurality of grooves GV are defined in the folding area FA-S.

Referring to FIG. 11B, the supporter SPL includes support blocks SB arranged corresponding to the folding area FA-S of the base layer SUB of FIG. 11A, a first support plate SPL-1 arranged corresponding to the first planar area NFA1-S of the base layer SUB of FIG. 11A, and a second support plate SPL-2 arranged corresponding to the second planar area NFA2-S of the base layer SUB of FIG. 11A.

The arrangement relationship between the grooves GV of FIG. 11A and the support blocks SB of FIG. 11B is the same as that described with reference to FIGS. 4A to 6, and thus, some detailed description thereof may be omitted.

Referring to FIG. 11C, in the second mode, the supporter SPL is arranged farther away from the folding axis FX than is base layer SUB. A groove GV-E located on the outermost side among the grooves GV overlaps the folding area FA-S and the planar area NFA1-S adjacent thereto. FIG. 11C illustrates the first planar area NFA1-S as an example. The groove GV-E located on the outermost side overlaps a portion of the first support plate SPL-1 and a portion of the support blocks SB adjacent thereto.

In the second mode, a distance R2 between the bottom surface of the base layer SUB within the groove GV-E located on the outermost side and the top surface of the support block SB becomes greater than a distance R1 between the bottom surface of the base layer SUB within the groove GV-E located on the outermost side and the top surface of the first support plate SPL-1. In the second mode, a distance R3 between the bottom surface of the base layer SUB within another groove GV and the top surface of a support block SB may be at least equal to or greater than the distance R2 between the bottom surface of the base layer SUB within the groove GV-E located on the outermost side and the top surface of the support block SB. As the occurring stress increases, the distance R3 between the bottom surface of the base layer SUB within the groove GV and the top surface of the support block SB may increase to distribute the stress.

According to some embodiments, the base layer SUB including stopper patterns EST is illustrated as an example. However, as illustrated in FIG. 9, the stopper pattern EST may be omitted.

Figure 12:
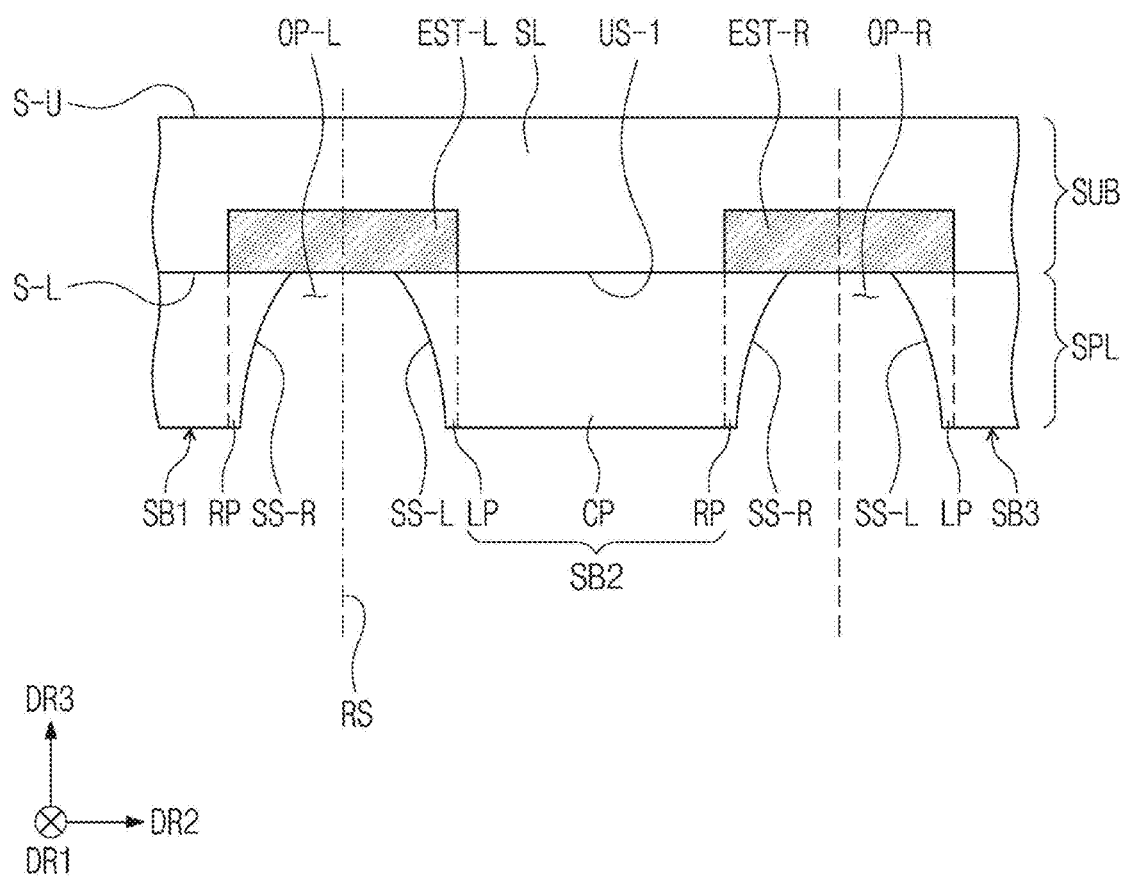
FIG. 12 is a cross-sectional view of a base layer and a supporter, which are coupled to each other, in a display device according to some embodiments of the inventive concept.

FIG. 12 is a cross-sectional view of a base layer SUB and a supporter SPL, which are coupled to each other, in a display device according to some embodiments of the inventive concept. Hereinafter, some duplicated description with respect to the display device described with reference to FIG. 1A to 6 may be omitted.

Referring to FIG. 12, the base layer SUB may include a plurality of stopper patterns EST-L and EST-R and a support layer SL. The plurality of stopper patterns EST-L and EST-R and the support layer SL may provide a bottom surface S-L of the base layer SUB, and the support layer SL may provide a top surface S-U of the base layer SUB. The bottom surface S-L and the top surface S-U of the base layer SUB may be parallel to each other.

FIG. 12 illustrates a first support block SB1, a second support block SB2, and a third support block SB3, and a first opening OP-L and a second opening OP-R which are positioned therebetween. The first opening OP-L and the second opening OP-R pass through the supporter SPL from one surface to the other surface in a third direction DR3. The first opening OP-L and the second opening OP-R overlap a first stopper pattern EST-L and a second stopper pattern EST-R, respectively.

The first opening OP-L is located on the left side of the second support block SB2, and the second opening OP-R is located on the right side of the second support block SB2. The second support block SB2 may be divided into a plurality of portions when viewed in a plan view. The second support block SB2 may include a first portion LP overlapping the first stopper pattern EST-L when viewed in a plan view, a second portion RP overlapping the second stopper pattern EST-R, and a third portion CP not overlapping the first stopper pattern EST-L and the second stopper pattern EST-R.

FIG. 12 illustrates, as an example, the second support block SB2 in which the entirety of a first side surface SS-L is provided in the first portion LP, and the entirety of a second side surface SS-R is provided in the second portion RP. However, the embodiments of the inventive concept are not limited thereto. The first portion LP of the second support block SB2 may include only a portion of the first side surface SS-L, and the second portion RP of the second support block SB2 may include only a portion of the second side surface SS-R.

The second side surface SS-R of the first support block SB1 and the first side surface SS-L of the second support block SB2 define the first opening OP-L, and the second side surface SS-R of the second support block SB2 and the first side surface SS-L of the third support block SB3 define the second opening OP-R.

Each of the first side surface SS-L and the second side surface SS-R may be a curved surface. The first side surface SS-L may be symmetric to the second side surface SS-R with respect to a reference plane RS having the second direction DR2 as a normal line. This shape is formed by the fabrication process, and this will be described later in detail.

FIGS. 13A to 13J are cross-sectional views illustrating a fabrication method of a display device according to some embodiments of the inventive concept. Hereinafter, some duplicated description with respect to the fabrication method of the display device described with reference to FIGS. 8A to 8G may be omitted.

Figure 13A:
Figure 13A:
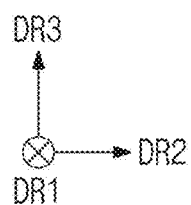

As illustrated in FIG. 13A, a support substrate SPL-P is provided. The support substrate SPL-P may be a glass substrate.

Figure 13B:
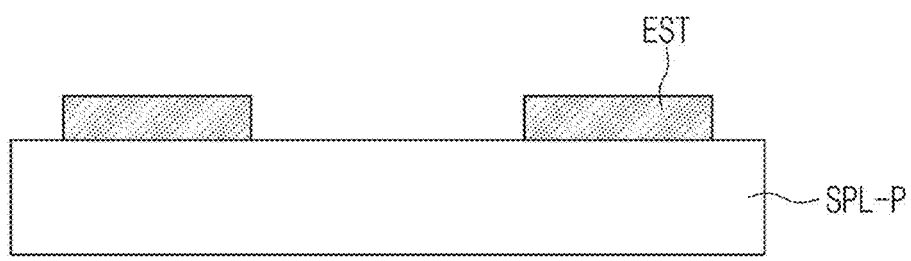
Figure 13B:
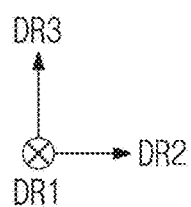

As illustrated in FIG. 13B, a plurality of stopper patterns EST are formed on one surface of the support substrate SPL-P. According to some embodiments, the stopper patterns EST may include metals.

Figure 13C:
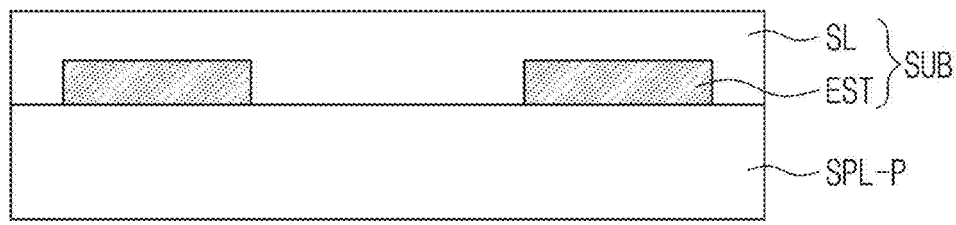

As illustrated in FIG. 13C, a support layer SL for covering the stopper patterns EST is formed on the top surface of the support substrate SPL-P. The support layer SL may include a synthetic resin.

Figure 13D:
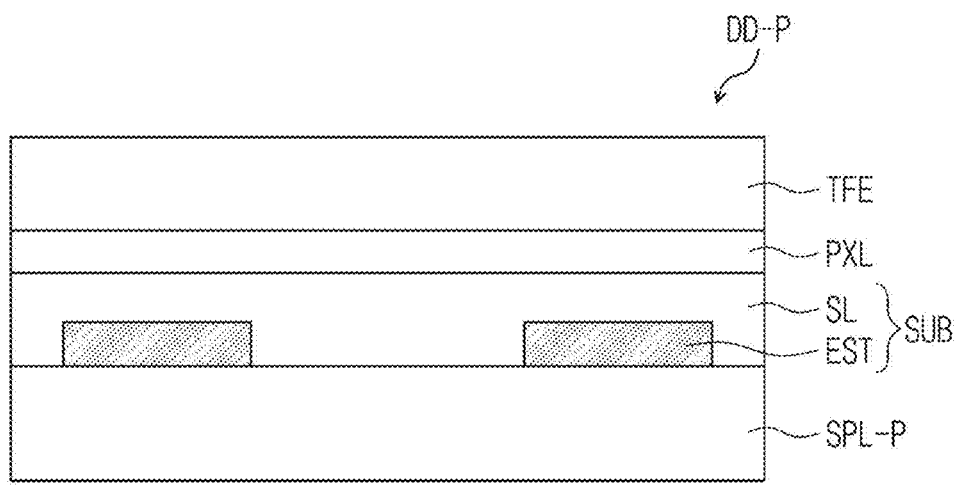

Subsequently, as illustrated in FIG. 13D, a pixel layer PXL and an encapsulation layer TFE are formed on the support layer SL. FIG. 13D illustrates a preliminary-display device DD-P formed in the middle of the fabrication process.

Figure 13E:
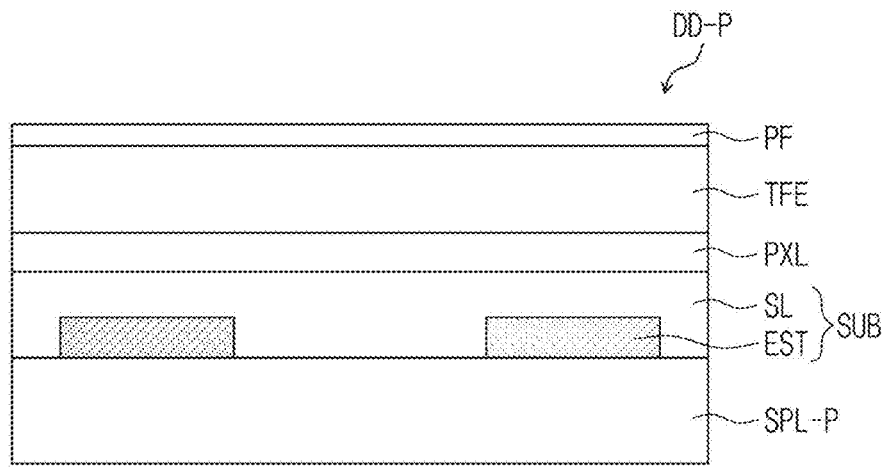
Figure 13E:
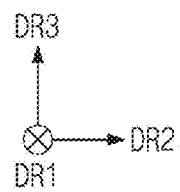

Next, as illustrated in FIG. 13E, a protection layer PF is formed on the top surface of the preliminary-display device DD-P. The protection layer PF may include a synthetic resin film. For example, the protection layer PF may include a polyurethane film, a polyethylene terephthalate film, or a polyethylene film which have high corrosion resistance. The protection layer PF may be attached to the encapsulation layer TFE through an adhesive layer.

Figure 13F:
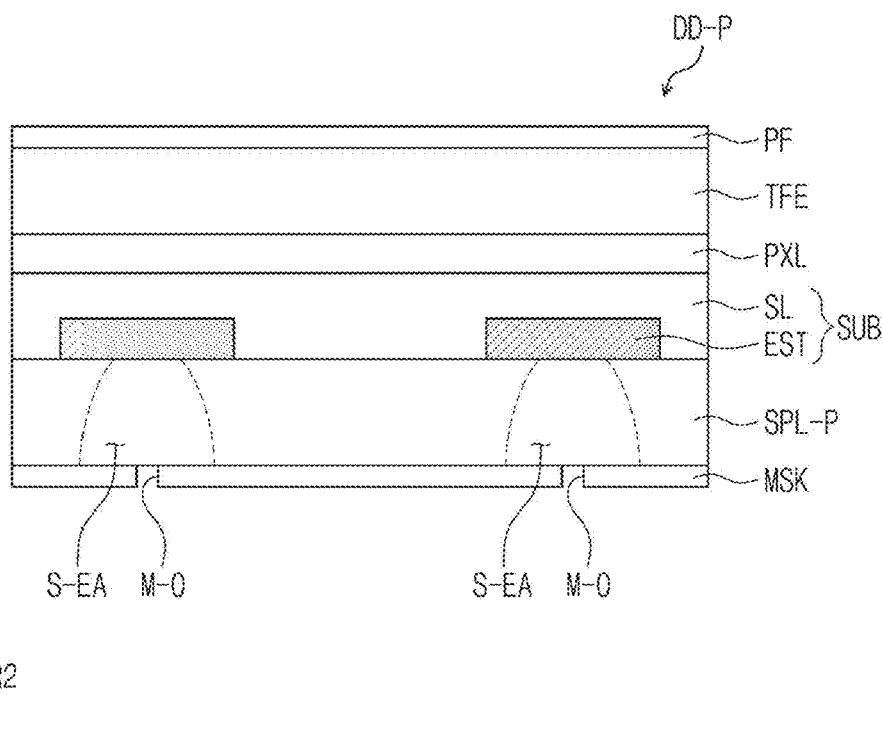

Next, as illustrated in FIG. 13F, a mask MSK is formed on the bottom surface of the preliminary-display device DD-P. The mask MSK is formed on the bottom surface of the support substrate SPL-P.

Openings M-O corresponding to the stopper patterns EST may be defined in the mask MSK. The lengths of the openings M-O in the first direction DR1 may be greater than or equal to the length of the support substrate SPL-P.

The mask MSK may include a photoresist layer or a synthetic resin layer. After the photoresist layer is formed on the bottom surface of the support substrate SPL-P, the openings M-O may be formed through exposure and development processes. The synthetic resin film having the openings M-O may be attached to the bottom surface of the support substrate SPL-P. The synthetic resin film may include the same material as the protection layer PF.

The width of each of the openings M-O in the second direction DR2 may be determined according to the surface area of a region S-EA (hereinafter, referred to as an etching area) of the support substrate SPL-P to be etched. In proportion to the width in the second direction DR2, the width of the etching area S-EA also increases.

Figure 13G:
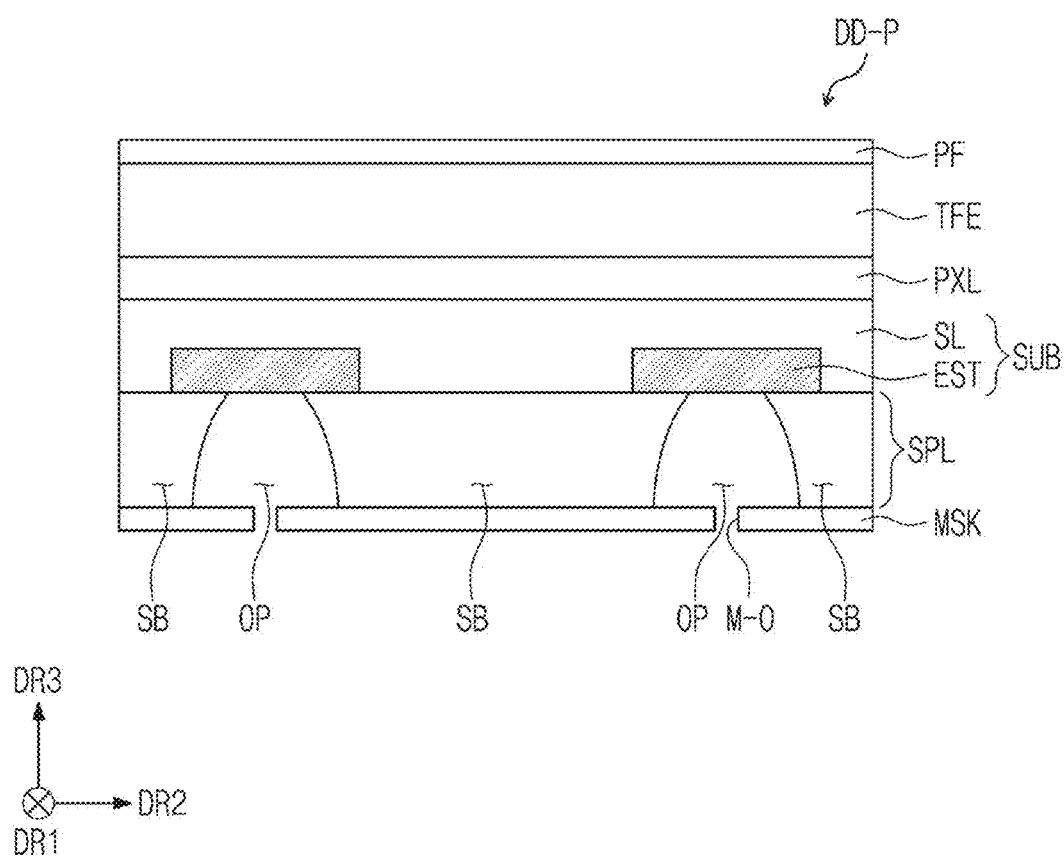

FIG. 13G illustrates a supporter SPL which is formed by performing the etching. The wet etch or dry etch may be performed. The wet etch is performed in a manner in which the preliminary-display device DD-P is immersed in an etching solution including hydrogen fluoride.

Support blocks SB are formed from the support substrate SPL-P. As openings OP are formed, the support substrate SPL-P is divided into the support blocks SB.

FIG. 13H shows a picture of the supporter SPL in which etching has been performed. A width W20 of the bottom surface of the supporter SPL exposed through the opening OP, that is, the exposed bottom surface of the stopper pattern EST may be determined by a width of the opening M-O of the mask MSK in the second direction DR2, a thickness T of the support substrate SPL-P, an etch rate, and an etch time.

Figure 13I:
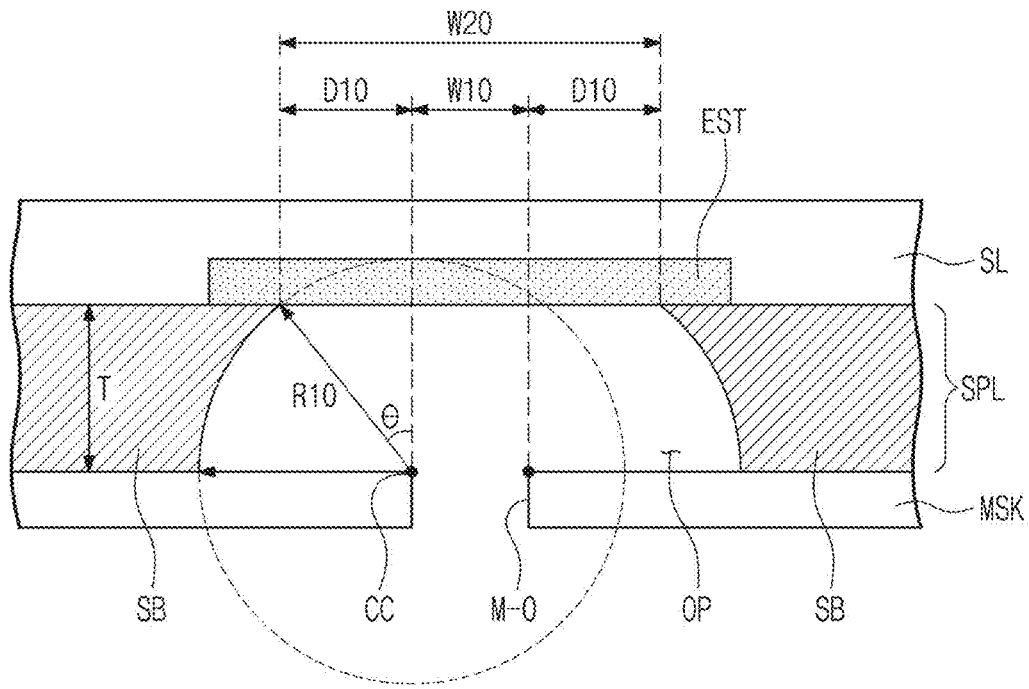

As illustrated in FIG. 13I, isotropic etching may be performed while the support substrate SPL-P (see FIG. 13F) is etched through the opening M-O. The isotropic etching may be performed along the circle of which a center CC is located on an apex of the mask MSK defining the opening M-O on the cross-section. As the etching is performed, the radius of the circle increases.

When the etching is sufficiently performed, the opening OP is formed, and the support substrate SPL-P is divided into the support blocks SB.

The width W20 of the exposed bottom surface of the stopper pattern EST is expressed Equation (1) to Equation (3). In Equation, W10 may be the width of the opening M-O in the second direction DR2.

$$W20 = 2 \times D10 + W10 \quad (1)$$

$$D10 = T \times \tan(\arccos(T/R10)) \quad (2)$$

$$R10 = \text{etch rate(length/time)} \times \text{etch time} \quad (3)$$

When the etching process is set, the width W20 of the exposed bottom surface of the stopper pattern EST may be controlled by adjusting the etch time.

Figure 13J:
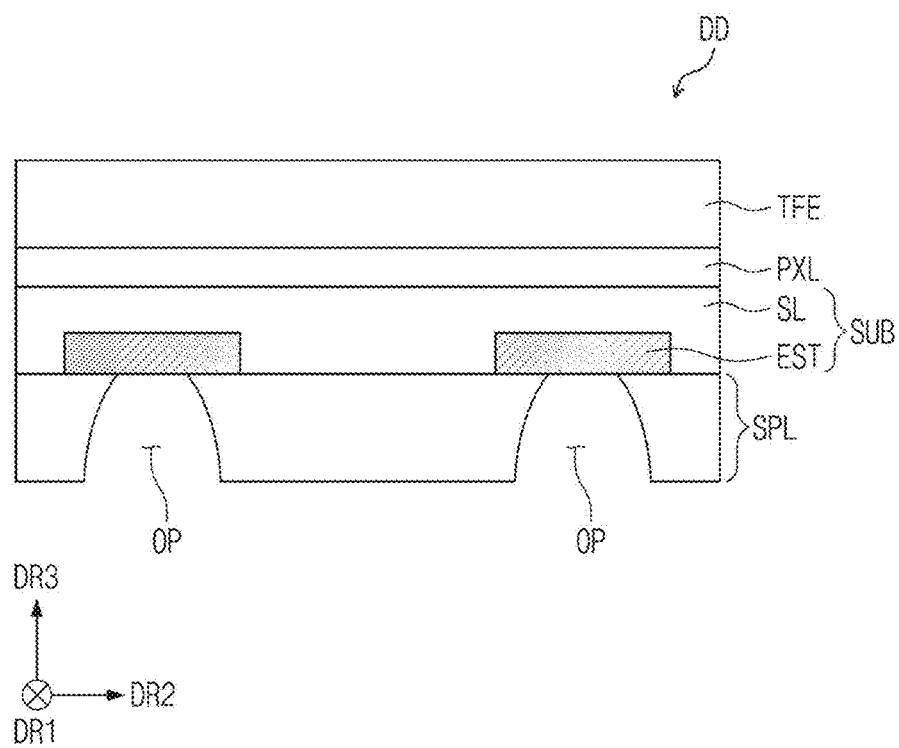

As illustrated in FIG. 13J, the protection layer PF and the mask MSK are removed after the etching process is finished. Accordingly, the display device DD may be fabricated.

Figure 14:
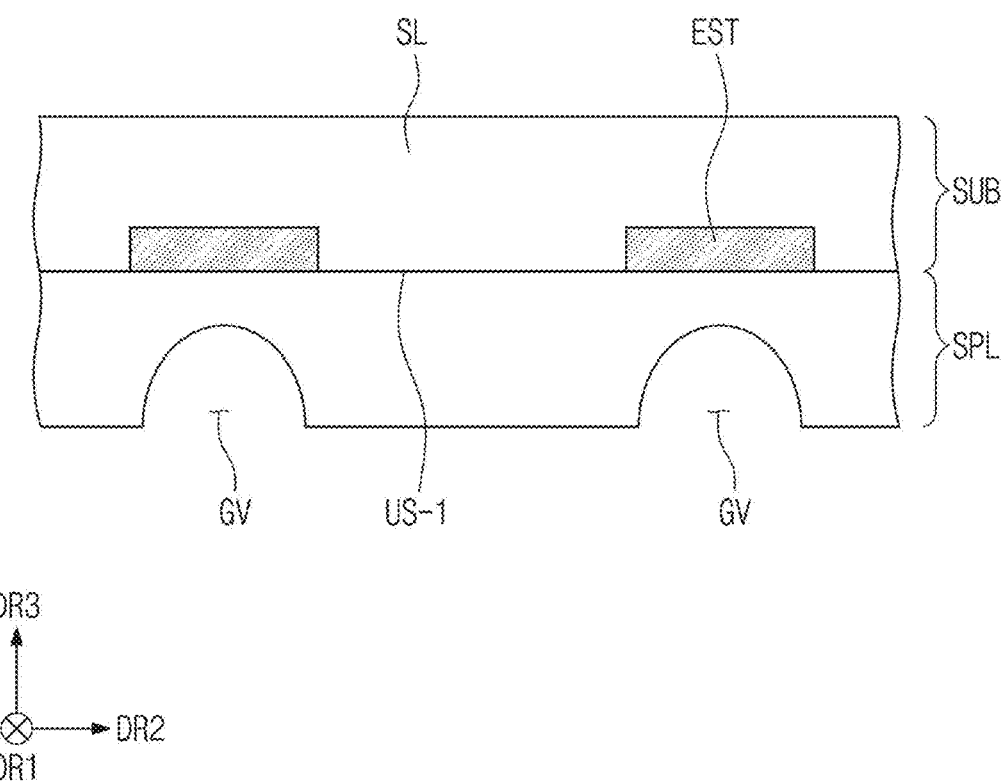
FIG. 14 is a cross-sectional view of a supporter coupled to a base layer of a display device according to some embodiments of the inventive concept.

FIG. 14 is a cross-sectional view of a supporter SPL coupled to a base layer SUB of a display device according to some embodiments of the inventive concept.

According to some embodiments, the opening OP (see FIG. 12) is not formed by the etching process, but a plurality of grooves GV are formed. When the etch time is reduced in the etching process described with reference to FIG. 13I, the plurality of grooves GV instead of the openings may be formed.

The base layer SUB may be supported without dividing areas of the supporter SPL, and the supporter SPL has relatively more flexible areas when compared to a case in which the grooves GV are not formed. Thus, rolling and folding may be more easily performed.

Figure 15:
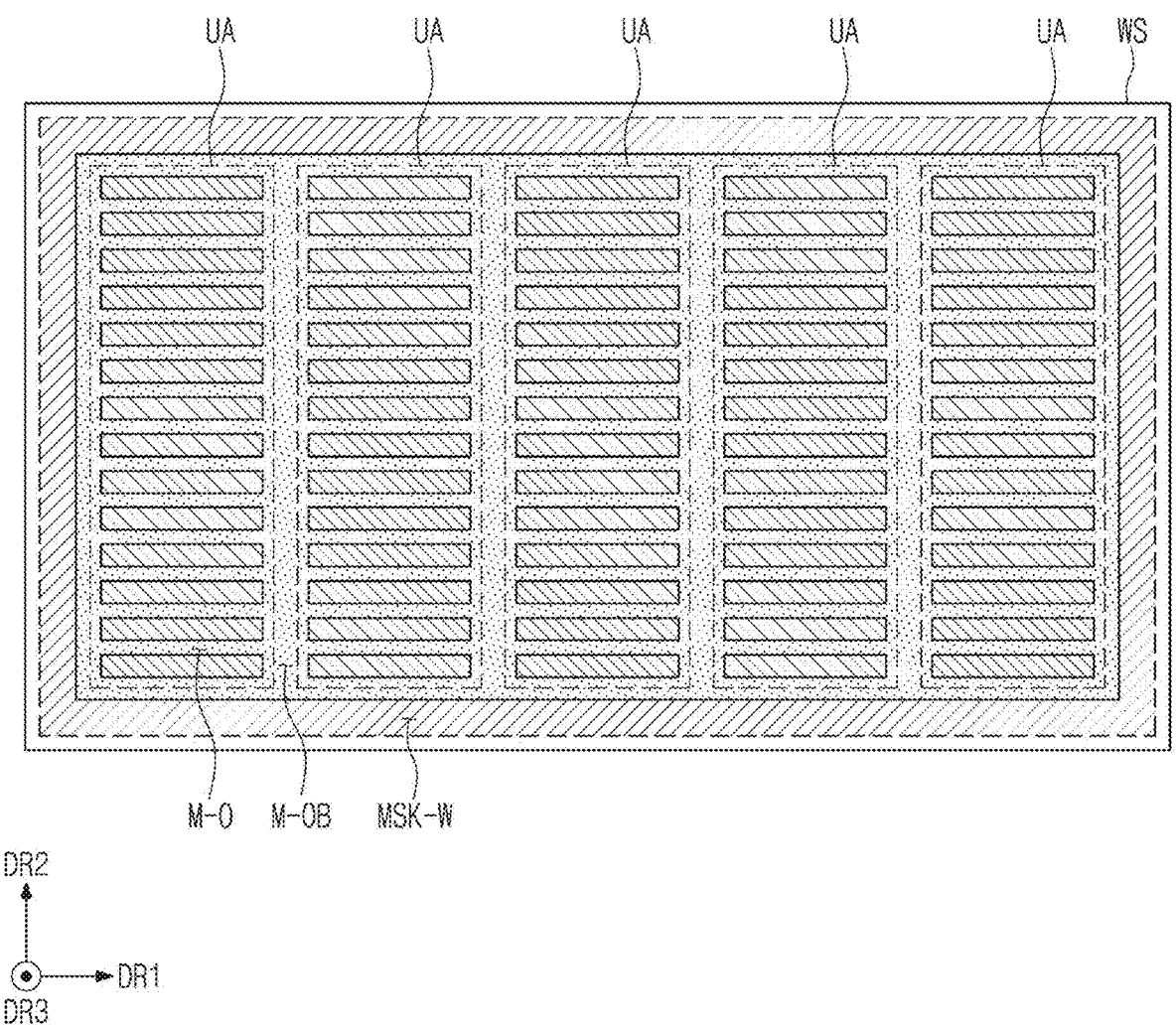
FIG. 15 is a plan view illustrating one process of a fabrication method of a display device according to some embodiments of the inventive concept.

FIG. 15 is a plan view illustrating one process of a fabrication method of a display device according to some embodiments of the inventive concept. FIG. 15 corresponds to FIG. 13F and illustrates the rear surface of a work substrate WS in which a mask MSK-W is formed.

The work substrate WS includes a plurality of unit areas UA. The fabrication method of the display device described with reference to FIGS. 13A to 13J is performed in each of the plurality of unit areas UA.

The openings M-O described with reference to FIG. 13G are illustrated in each of the plurality of unit areas UA. The openings M-O extend in a first direction DR1 and are arranged in a second direction DR2.

Openings M-OB of the mask MSK-W are formed in boundary areas between the plurality of unit areas UA. When the openings OP are formed in the etching process described with reference to FIG. 13G, the boundary areas between the plurality of unit areas UA of the work substrate WS are etched.

An additional cutting process for the work substrate so as to separate display devices formed in the plurality of unit areas UA is not required. However, a cutting process for separating boundary areas of the support layer SL, the pixel layer PXL, and the encapsulation layer TFE illustrated in FIG. 13J may be performed.

As described above, when the display device is rolled or folded, the local stress is not applied to the specific areas of the display panel. The stress may be distributed on the entire display panel. Thus, the defects of the display panel may be reduced.

The patterning of the support substrate and the removal of the sacrificial patterns are performed during the same fabrication process. The fabrication process may be relatively simplified, and thus the fabrication time may be relatively shortened.

The support substrate used in the fabrication of the display device may be utilized as the support block for the display device.

Although aspects of some embodiments of the present disclosure have been described with reference to the embodiments, it will be understood that various changes and modifications of the present disclosure may be made by one ordinary skilled in the art or one having ordinary knowledge in the art without departing from the spirit and technical field of embodiments according to the present disclosure as hereinafter claimed.

Hence, the technical scope of embodiments according to the inventive concept is to be determined by the following claims, and their equivalents, and should not be limited by the foregoing description.

What is claimed is:

1. A display device comprising:
 a display panel comprising a base layer, wherein the base layer comprises a plurality of stopper patterns and a support layer coupled to the plurality of stopper patterns, each of the plurality of stopper patterns extends along a first direction, and the plurality of stopper patterns are arranged along a second direction crossing the first direction; and
 a supporter supporting a bottom surface of the base layer which is defined by the plurality of stopper patterns and the support layer,
 wherein the supporter comprises a plurality of support blocks extending along the first direction and which are arranged along the second direction,
 the plurality of support blocks comprise a first support block and a second support block which are spaced apart from each other in the second direction,
 the plurality of stopper patterns comprise a first stopper pattern and a second stopper pattern which are spaced apart from each other in the second direction, and
 the first support block comprises a second portion that overlaps the first stopper pattern in a plan view, and the second support block comprises a first portion that overlaps the first stopper pattern in the plan view,
 wherein each of the plurality of support blocks comprises glass.

2. The display device of claim 1, wherein a groove is defined in each of the plurality of stopper patterns, and the groove extends along the first direction.

3. The display device of claim 2, wherein a length of the groove in the first direction is substantially the same as a length of the base layer in the first direction.

4. The display device of claim 1, wherein a portion of a top surface of the second support block is in contact with the first stopper pattern and the support layer.

5. The display device of claim 1, wherein a first groove is defined in the first stopper pattern, and a second groove is defined in the second stopper pattern,
 wherein a portion of a top surface of the second support block is in contact with the first stopper pattern and the support layer, and another portion of the top surface of the second support block overlaps the first groove.

6. The display device of claim 5, wherein a width of the first groove is greater than a minimum gap between the first support block and the second support block.

7. The display device of claim 5, wherein the display panel is configured to have a flat display surface in a first mode, and the display panel is configured to be wound on a roller in a second mode,
 wherein a distance in the second mode between the second support block and the bottom surface of the base layer corresponding to the first groove is greater than a distance in the first mode between the second support block and the bottom surface of the base layer corresponding to the first groove.

8. The display device of claim 5, wherein the second support block further comprises a second portion overlapping the second stopper pattern and a third portion between the first portion of the second support block and the second portion of the second support block.

9. The display device of claim 1, wherein a gap between the first support block and the second support block is tapered such that the gap is the smallest on an extension line of a top surface of the first support block and a top surface of the second support block, and the gap between the first support block and the second support block is the largest on an extension line of a bottom surface of the first support block and a bottom surface of the second support block.

10. The display device of claim 1, wherein the support layer comprises a synthetic resin, and each of the plurality of stopper patterns comprises a metal.

11. The display device of claim 1, wherein the display panel comprises one end and an other end that face each other in the second direction, and the plurality of support blocks further comprise a first outer support block and a second outer support block with the first support block and the second support block therebetween, wherein the first outer support block supports the one end of the display panel, and the second outer support block supports the other end of the display panel.

12. The display device of claim 1, wherein the display panel further comprises:

a pixel layer on a top surface of the base layer; and an encapsulation layer on the pixel layer.

13. The display device of claim 1, wherein the display panel comprises a first planar area, a folding area, and a second planar area arranged in the second direction, the plurality of support blocks overlap the folding area, and the supporter further comprises a first support plate overlapping the first planar area and a second support plate overlapping the second planar area.

14. The display device of claim 13, wherein a groove is defined in each of the plurality of stopper patterns, and among the plurality of stopper patterns, a stopper pattern on an outermost side in the second direction overlaps the folding area and the first planar area.

15. The display device of claim 1, wherein a side surface of the second portion of the first support block is a curve surface, and a side surface of the first portion of the second support block is a curve surface.

16. The display device of claim 1, wherein a side surface of the second portion of the first support block is symmetric to a side surface of the first portion of the second support block with respect to a reference plane having the second direction as a normal line.

17. A display device comprising:

a display panel comprising a base layer that comprises a first groove and a second groove defined in a bottom surface thereof; and a supporter supporting the bottom surface of the base layer and comprising a first support block overlapping the first groove, a second support block overlapping the first groove and the second groove, and a third support block overlapping the second groove, wherein a second area of a support surface of the first support block is spaced apart from the base layer by the first groove, a first area of a support surface of the second support block is spaced apart from the base layer by the first groove, and a second area of the support surface of the second support block is spaced apart from the base layer by the second groove, and a first area of a support surface of the third support block is spaced apart from the base layer by the second groove, wherein each of the first second, and third support blocks comprises glass.

18. A display device comprising:

a display panel comprising a base layer, wherein the base layer comprises a plurality of stopper patterns and a support layer coupled to the plurality of stopper patterns, each of the plurality of stopper patterns extends along a first direction, and the plurality of stopper patterns are arranged along a second direction crossing the first direction; and a glass supporter supporting the plurality of stopper patterns and the support layer, the glass supporter having a plurality of grooves which are defined in a bottom surface thereof and respectively correspond to the plurality of stopper patterns.

* * * * *

UNITED STATES PATENT AND TRADEMARK OFFICE
CERTIFICATE OF CORRECTION

PATENT NO. : 12,387,630 B2
APPLICATION NO. : 17/656560
DATED : August 12, 2025
INVENTOR(S) : Yi Joon Ahn et al.

Page 1 of 1

It is certified that error appears in the above-identified patent and that said Letters Patent is hereby corrected as shown below:

In the Claims

In Column 20, Line 32, in Claim 17, after "first" insert -- , --.

Signed and Sealed this
Thirteenth Day of January, 2026

John A. Squires
*Director of the United States Patent and Trademark Office*